United States Patent
Lee et al.

(10) Patent No.: US 11,889,643 B2
(45) Date of Patent: Jan. 30, 2024

(54) EXTENSION KIT AND STORAGE DEVICE ASSEMBLY INCLUDING THE SAME

(71) Applicant: SAMSUNG ELECTRONICS CO., LTD., Suwon-si (KR)

(72) Inventors: Han Hong Lee, Seoul (KR); Jae Hong Park, Suwon-si (KR); Seon Gyun Baek, Suwon-si (KR); Yusuf Cinar, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 142 days.

(21) Appl. No.: 17/329,900

(22) Filed: May 25, 2021

(65) Prior Publication Data
US 2022/0053656 A1 Feb. 17, 2022

(30) Foreign Application Priority Data

Aug. 13, 2020 (KR) .................. 10-2020-0102026
Dec. 10, 2020 (KR) .................. 10-2020-0171953

(51) Int. Cl.
*H05K 5/02* (2006.01)
*H05K 5/00* (2006.01)

(52) U.S. Cl.
CPC ......... *H05K 5/0221* (2013.01); *H05K 5/0008* (2013.01); *H05K 5/023* (2013.01)

(58) Field of Classification Search
CPC .... H05K 5/0221; H05K 5/0008; H05K 5/023; H05K 7/1417; G06F 1/1658; G06F 1/187; H01R 13/627; H01R 13/639; H01R 2201/06; G11B 33/04
See application file for complete search history.

(56) References Cited

U.S. PATENT DOCUMENTS

| 8,054,635 | B2 | 11/2011 | Olesiewicz et al. |
| 8,416,563 | B2 * | 4/2013 | Hou ............ H05K 7/1489 361/679.33 |
| 9,025,278 | B1 | 5/2015 | Chen et al. |
| 9,135,957 | B2 | 9/2015 | Grobe et al. |

(Continued)

FOREIGN PATENT DOCUMENTS

KR   10-1490499 B1   2/2015

OTHER PUBLICATIONS

Communication dated Feb. 9, 2022 issued by the European Patent Office in counterpart European Application No. 21 190 634.2.

(Continued)

*Primary Examiner* — Abhishek M Rathod
*Assistant Examiner* — Keith DePew
(74) *Attorney, Agent, or Firm* — Sughrue Mion, PLLC

(57) ABSTRACT

An extension kit includes a case, a locking lever, and a first elastic member. The case has an interior space which extends in a first direction. The locking lever includes a lever portion which is rotatable about a first rotation axis extending in a second direction intersecting the first direction, a plate portion which extends from the lever portion and which is exposed at the case, an arm portion which extends in the second direction from the plate portion, and a first locking portion which protrudes from the arm portion. The first elastic member is provided in the interior space of the case and elastically connects the case and the locking lever in the interior space of the case.

16 Claims, 22 Drawing Sheets

(56) References Cited

U.S. PATENT DOCUMENTS

| | | | |
|---|---|---|---|
| 9,603,280 B2 * | 3/2017 | Frank | H05K 7/20436 |
| 9,947,371 B1 | 4/2018 | Hu et al. | |
| 10,008,791 B1 | 6/2018 | Masumoto et al. | |
| 10,185,686 B2 | 1/2019 | Nguyen et al. | |
| 10,192,589 B2 | 1/2019 | Chen et al. | |
| 10,261,554 B1 * | 4/2019 | Lin | G11B 33/124 |
| 10,622,026 B1 * | 4/2020 | Tsorng | H05K 5/0282 |
| 10,674,621 B1 * | 6/2020 | Tsorng | H05K 5/0291 |
| 10,932,383 B2 * | 2/2021 | Ehlen | H05K 5/0221 |
| 10,939,573 B1 * | 3/2021 | Liao | H01R 13/62983 |
| 2004/0077198 A1 * | 4/2004 | Schlack | H05K 7/1409 |
| | | | 439/160 |
| 2007/0202732 A1 * | 8/2007 | Yahiro | H01R 13/6275 |
| | | | 439/326 |
| 2014/0218879 A1 | 8/2014 | Yin et al. | |
| 2018/0303489 A1 | 10/2018 | Walzman | |
| 2019/0018207 A1 * | 1/2019 | Koutrokois | G02B 6/4261 |
| 2019/0108860 A1 | 4/2019 | Han et al. | |
| 2020/0229317 A1 | 7/2020 | Martinez Araiza et al. | |
| 2021/0176881 A1 * | 6/2021 | Lin | H05K 7/1409 |
| 2021/0274667 A1 * | 9/2021 | Lin | H05K 7/1411 |
| 2022/0115800 A1 * | 4/2022 | Kim | H01R 12/57 |
| 2022/0117107 A1 * | 4/2022 | Hur | H05K 5/026 |

OTHER PUBLICATIONS

Communication dated Jan. 28, 2022 issued by the European Patent Office in counterpart European Application No. 21190634.2.

* cited by examiner

EXTENSION KIT AND STORAGE DEVICE ASSEMBLY INCLUDING THE SAME

CROSS-REFERENCE TO RELATED APPLICATION

This application claims priority from Korean Provisional Application No. 10-2020-0102026 filed on Aug. 13, 2020 in the Korean Intellectual Property Office and Korean Patent Application No. 10-2020-0171953 filed on Dec. 10, 2020 in the Korean Intellectual Property Office, the entire contents of each of which are herein incorporated by reference in their entireties.

BACKGROUND

1. Technical Field

The present disclosure relates to an extension kit and a storage device assembly including the same.

2. Description of the Related Art

Storage devices including solid state drives (SSDs) are devices that receive data from a host and store the received data. Such storage devices are widely used not only in traditional electronic devices such as desktop personal computers (PCs), tablet PCs, and laptop PCs, but also electronic devices related to mobilities such as automobiles, drones, and aircrafts.

A plurality of storage devices may be used in an electronic device and may be mounted or dismounted as necessary. Therefore, there is a need for research to improve the mounting/dismounting performance of a storage device.

SUMMARY

It is an aspect to provide an extension kit that is easily mountable and dismountable.

It is another aspect to provide a storage device assembly including an extension kit that is easily mountable and dismountable.

According to an aspect of one or more embodiments, there is provided an extension kit comprising a case having an interior space which extends in a first direction; a locking lever including a lever portion which is rotatable about a first rotation axis extending in a second direction intersecting the first direction, a plate portion which extends from the lever portion and which is exposed at the case, an arm portion which extends in the second direction from the plate portion, and a first locking portion which protrudes from the arm portion; and a first elastic member in the interior space of the case, the first elastic member configured to elastically connect the case and the locking lever in the interior space of the case.

According to another aspect of one or more embodiments, there is provided a storage device assembly comprising a storage device having a fixing hole; and an extension kit configured to be mounted to and dismounted from the storage device, wherein the extension kit includes a case having a front surface facing the storage device and a rear surface opposite to the front surface; a locking lever including a lever portion which is supported by the case to be rotatable, and a locking portion which extends from the lever portion and is disposed above the fixing hole in a configuration in which the extension kit is mounted to the storage device; and a handle including a first rotation portion which is supported by the case to be rotatable, and a first support portion which extends from the first rotation portion and which is disposed at the rear surface of the case.

According to yet another aspect of one or more embodiments, there is provided a storage device comprising memory module and an enclosure which includes an upper plate covering an upper surface of the memory module, and a first sidewall and a second sidewall respectively covering both sides of the memory module, wherein the upper plate includes a first long side and a second long side respectively extending in a first direction and facing each other, and a first short side and a second short side respectively extending in a second direction intersecting the first direction and facing each other, the upper plate includes a extension part which extends in the first direction further than one end of the first sidewall and one end of the second sidewall and includes the first short side, the extension part includes a fixing hole penetrating the extension part in a third direction intersecting the first direction and the second direction the fixing hole includes a through-hole portion extending in the third direction, and expansion hole portion connected to the through-hole portion in the third direction, the expansion hole portion is opened to the first short side of the upper plate.

BRIEF DESCRIPTION OF THE DRAWINGS

The above and other aspects will become more apparent by describing exemplary embodiments thereof in detail with reference to the attached drawings, in which.

DETAILED DESCRIPTION

It should be noted that aspects are not limited to the above-described aspects, and other aspects of the present disclosure will be apparent to those skilled in the art from the following descriptions. Hereinafter, an extension kit and a storage device assembly including the same according to exemplary embodiments will be described with reference to the accompanying drawings.

Figure 1:
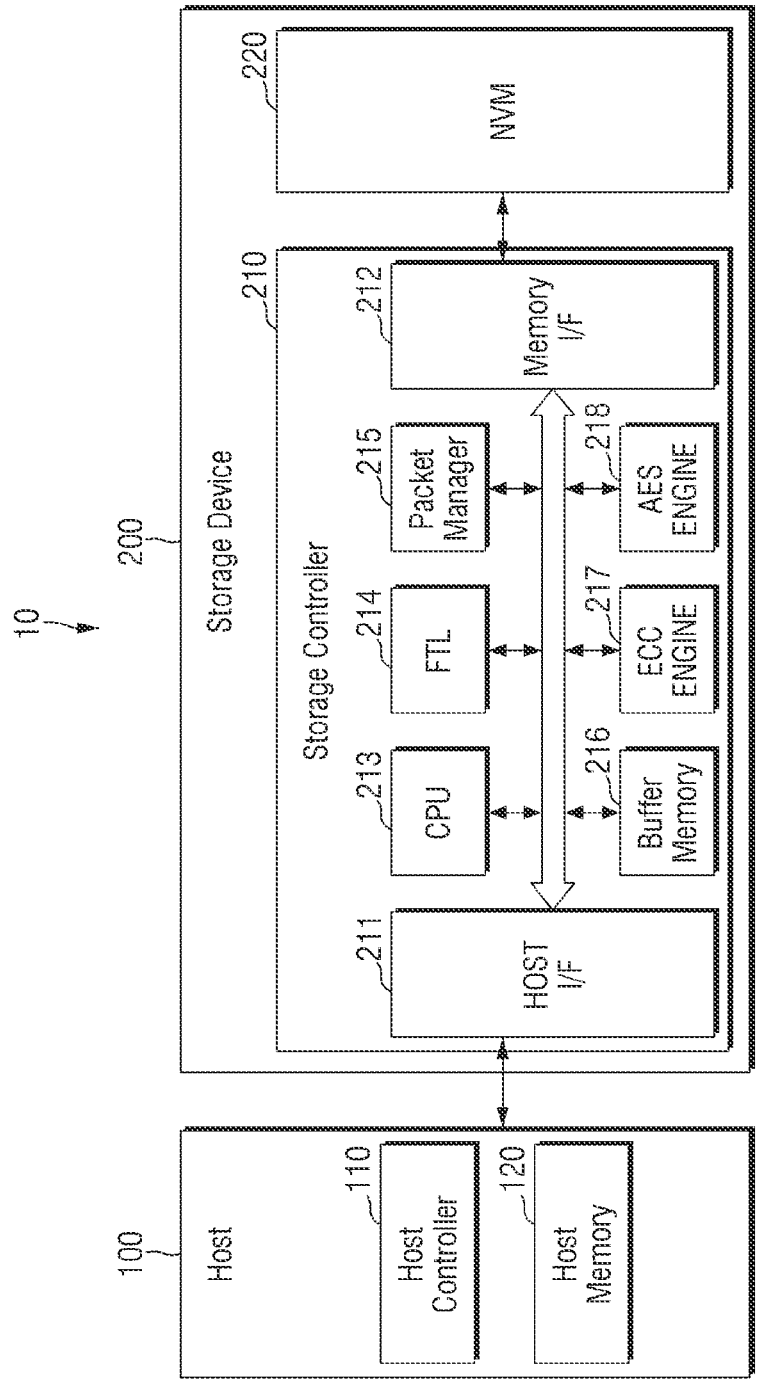
FIG. 1 is a block diagram illustrating a host-storage system according to some exemplary embodiments.

FIG. 1 is a block diagram illustrating a host-storage system according to some exemplary embodiments.

Referring to FIG. 1, a host-storage system 10 may include a host 100 and a storage device 200.

The host 100 may include a host controller 110 and a host memory 120. The host memory 120 may function as a buffer memory for temporarily storing data to be transmitted to the storage device 200 or data transmitted from the storage device 200.

The storage device 200 may include a storage controller 210 and a nonvolatile memory (NVM) 220. The storage device 200 may include storage media for storing data according to the request of the host 100. For example, the storage device 200 may include at least one of a solid state drive (SSD), an embedded memory, and a detachable external memory. For example, when the storage device 200 is the SSD, the storage device 200 may be a device following an NVM express (NVMe) standard. For another example, when the storage device 200 is the embedded memory or the external memory, the storage device 200 may be a device according to a universal flash storage (UFS) or embedded multi-media card (eMMC) standard. The host 100 and the storage device 200 may each generate and transmit a packet according to an adopted standard protocol.

When the NVM 220 of the storage device 200 includes a flash memory, the flash memory may include a two-dimensional (2D) NAND memory array or a three-dimensional (3D) NAND (or vertical NAND (VNAND)) memory array. For another example, the storage device 200 may include various other types of NVMs. For example, the storage device 200 may include a magnetic random-access memory (MRAM), a spin-transfer torque MRAM, a conductive bridging RAM (CBRAM), a ferroelectric RAM (FeRAM), a phase RAM (PRAM), a resistive RAM, and various other types of memories.

In some exemplary embodiments, the host controller 110 and the host memory 120 may be implemented as separate semiconductor chips. Alternatively, in some exemplary embodiments, the host controller 110 and the host memory 120 may be integrated in the same semiconductor chip. As an example, the host controller 110 may be one of a plurality of modules included in an application processor, and such an application processor may be implemented as a system-on-chip (SoC). In addition, the host memory 120 may be an embedded memory included in the application processor or may be an NVM or memory module disposed outside the application processor.

The host controller 110 may manage an operation of storing data (for example, record data) of a buffer region in the NVM 220 or an operation of storing data (for example, read data) of the NVM 220 in the buffer region.

The storage controller 210 may include a host interface (I/F) 211, a memory interface (I/F) 212, and a central processing unit (CPU) 213. In addition, the storage controller 210 may further include a flash translation layer (FTL) 214, a packet manager 215, a buffer memory 216, an error correction code (ECC) engine 217, and an advanced encryption standard (AES) engine 218.

The storage controller 210 may further include a working memory (not shown) in which the FTL 214 is loaded and may execute the FTL 214 in the CPU 213 to control data write and read operations with respect to the NVM 220.

The host interface (I/F) 211 may transmit and receive a packet to and from the host 100. A packet transmitted from the host 100 to the host interface 211 may include a command or data to be recorded in the NVM 220, and a packet transmitted from the host interface 211 to the host 100 may include a response to the command or data read from the NVM 220.

The memory interface (I/F) 212 may transmit data to be recorded to the NVM 220 to the NVM 220 or may receive data read from the NVM 220. The memory interface 212 may be implemented to follow a protocol such as Toggle or ONFi.

The FTL 214 may perform various functions such as address mapping, wear-leveling, and garbage collection. An address mapping operation is an operation of converting a logical address received from the host into a physical address used to actually store data in the NVM 220. The wear-leveling is a technique for preventing excessive degradation of a specific block by allowing blocks in the NVM 220 to be used uniformly. For example, the wear-leveling may be implemented through a firmware technique for balancing erase counts of physical blocks. The garbage collection is a technique for securing an available capacity in the NVM 220 through a method of copying valid data of a block to a new block and then erasing an existing block.

The packet manager 215 may generate a packet according to a protocol of an interface pre-defined with the host 100 or may parse various types of information from a packet received from the host 100. In addition, the buffer memory 216 may temporarily store data to be recorded in the NVM 220 or data to be read from the NVM 220. The buffer memory 216 may be a component provided in the storage controller 210 but may be disposed outside the storage controller 210.

The ECC engine 217 may perform functions of detecting and correcting an error of read data read from the NVM 220. More specifically, the ECC engine 217 may generate parity bits for write data to be written in the NVM 220, and the generated parity bits may be stored in the NVM 220 together with the write data. When data is read from the NVM 220, the ECC engine 217 may correct an error of the read data using the parity bits read from the NVM 220 together with the read data and may output the error-corrected read data.

The AES engine 218 may perform at least one of an encryption operation and a decryption operation on data input to the storage controller 210 using a symmetric-key algorithm.

Figure 2:
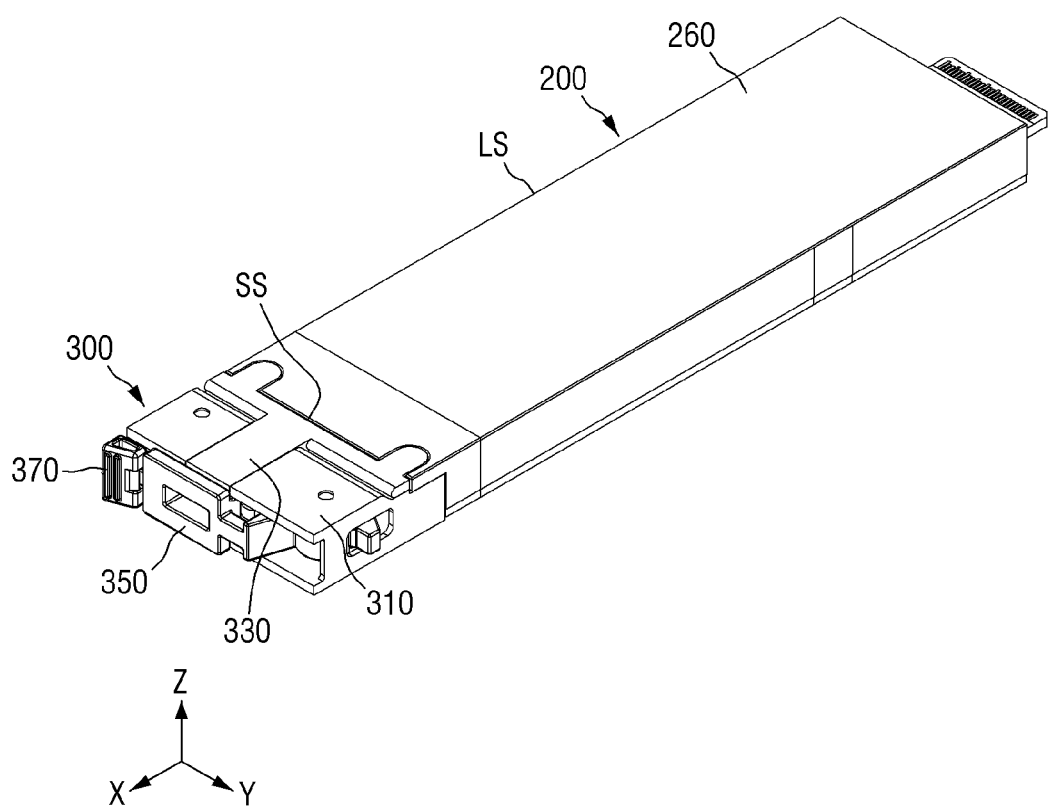
FIG. 2 is a perspective view for describing a storage device assembly according to some exemplary embodiments.
Figure 3:
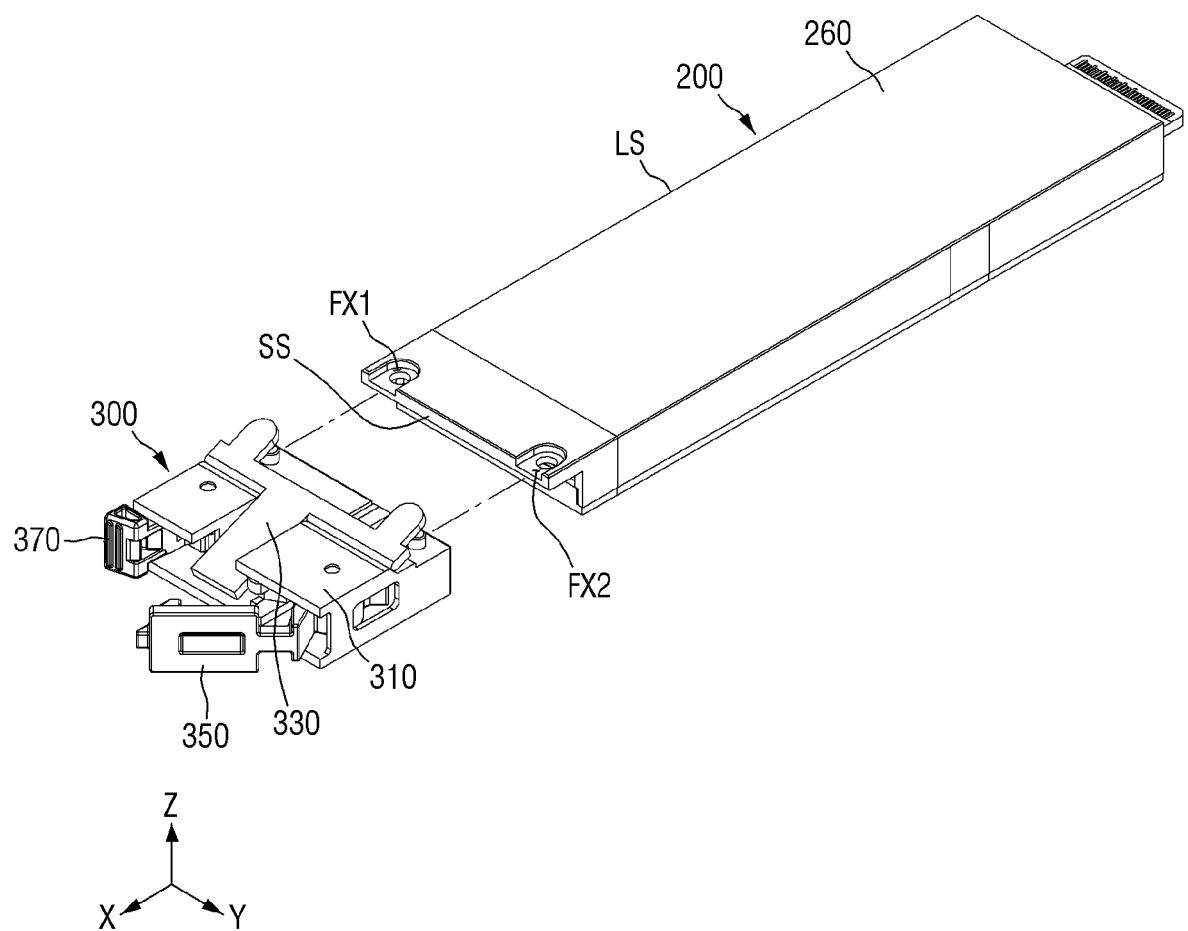
FIG. 3 is an exploded perspective view of the storage device assembly of FIG. 2.
Figure 4:
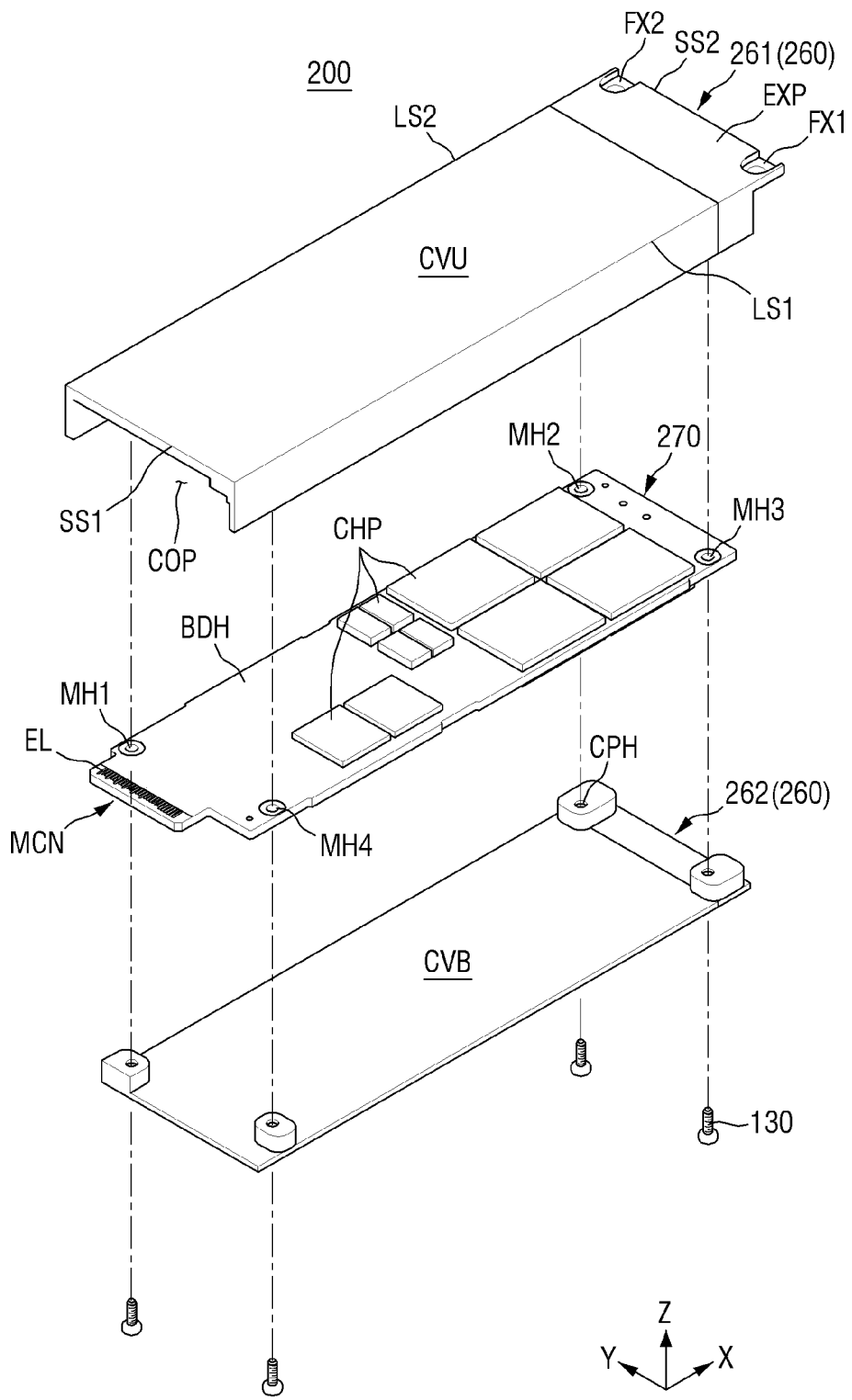
FIGS. 4 and 5 are exploded perspective views for describing a storage device of the storage device assembly of FIG. 2.
Figure 5:
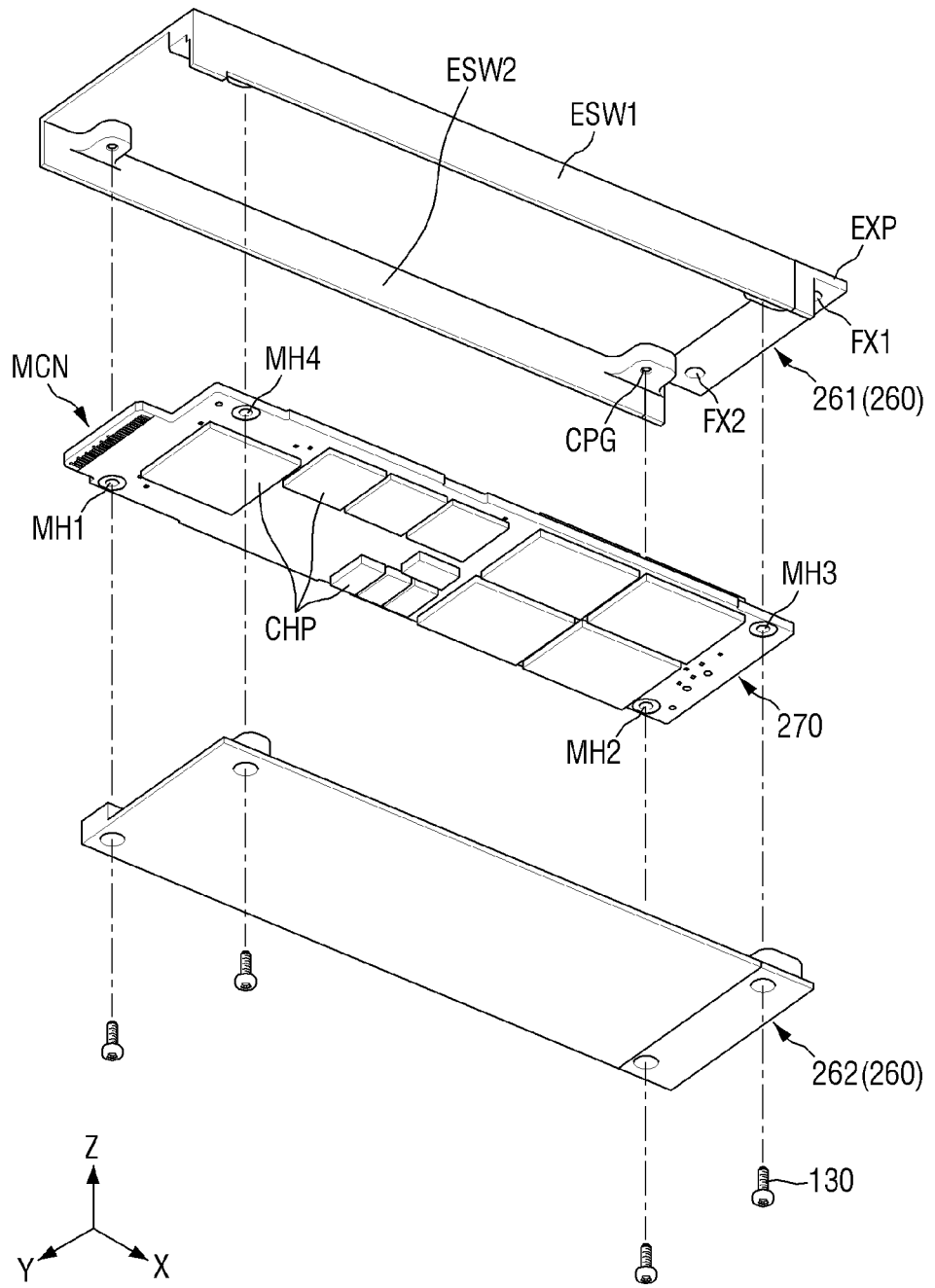
Figure 6:
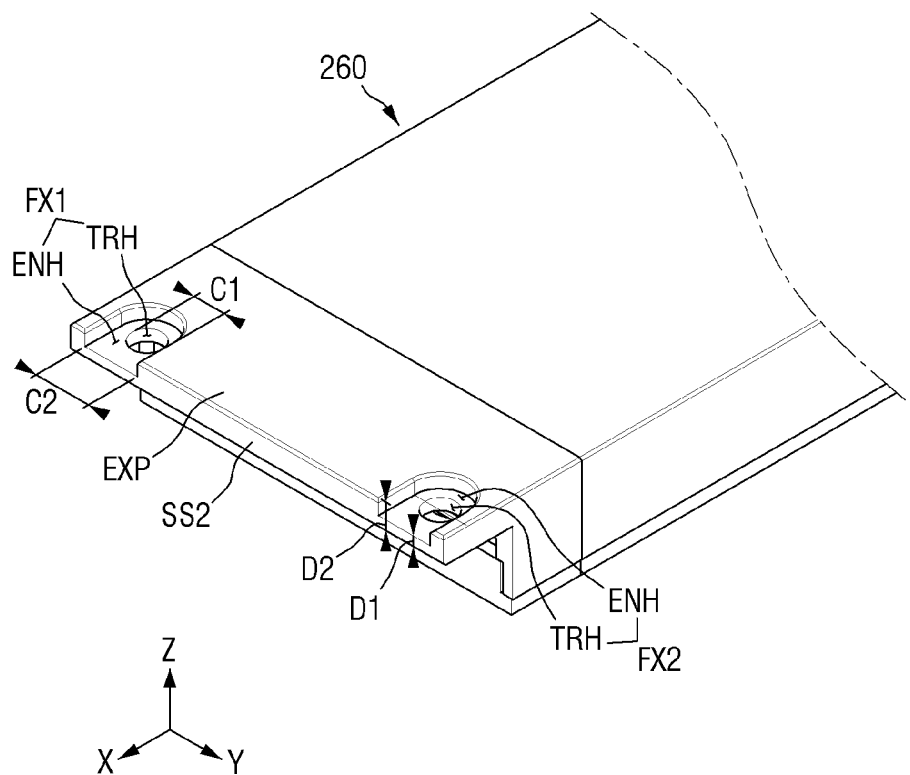
FIG. 6 is a partially enlarged perspective view for describing the storage device of the storage device assembly of FIG. 2.
Figure 7:
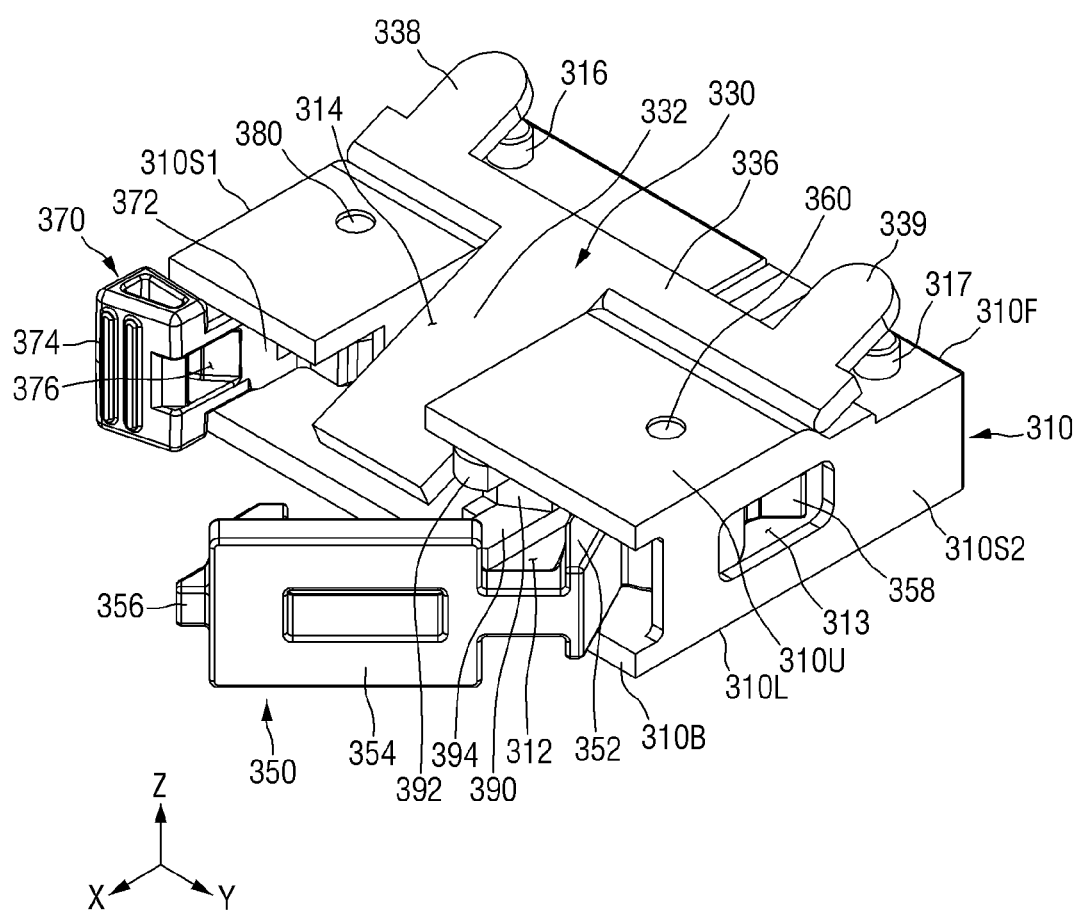
FIGS. 7 and 8 are perspective views for describing an extension kit of the storage device assembly of FIG. 2.
Figure 8:
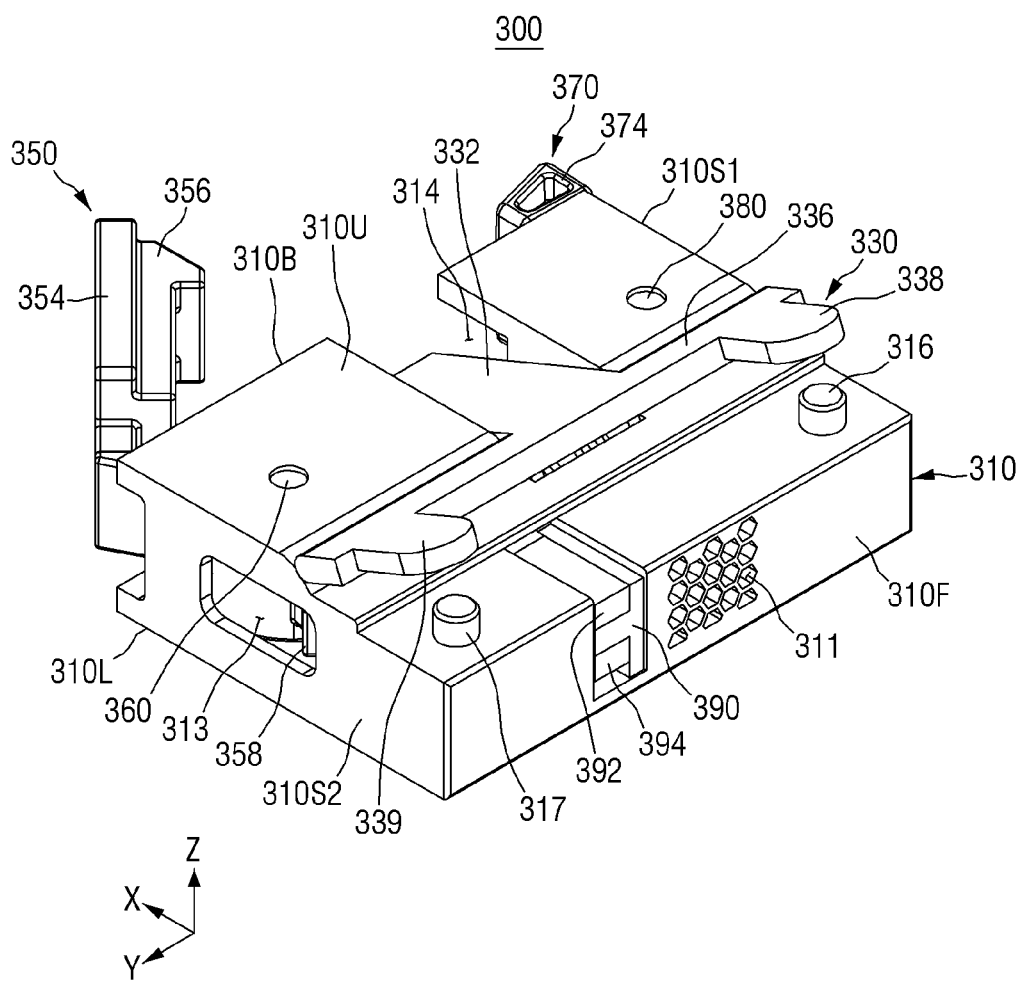
Figure 9:
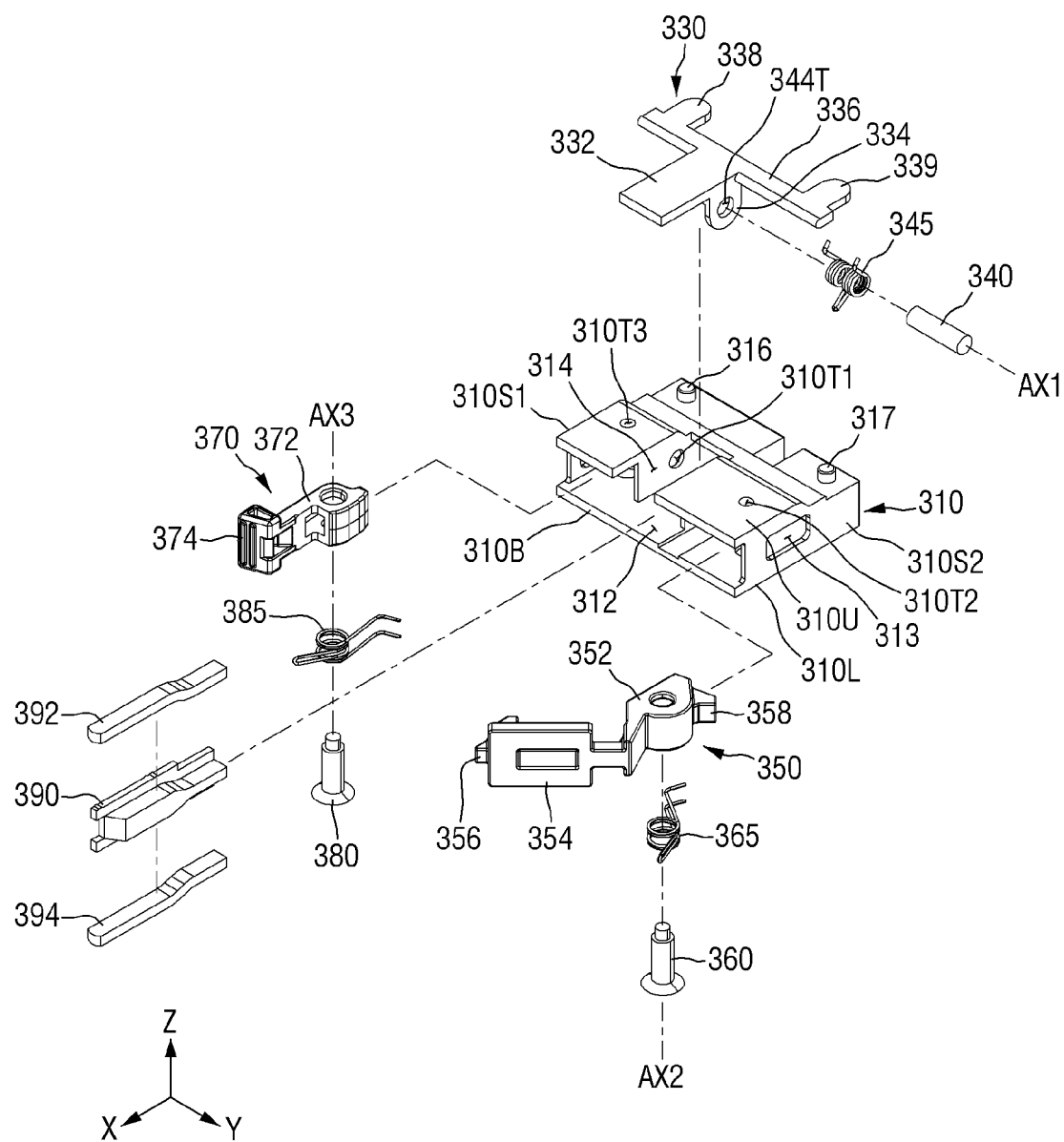
FIG. 9 is an exploded perspective view for describing the extension kit of the storage device assembly of FIG. 2.

FIG. 2 is a perspective view for describing a storage device assembly according to some exemplary embodiments. FIG. 3 is an exploded perspective view of a storage device of the storage device assembly of FIG. 2. FIGS. 4 and 5 are exploded perspective views for describing a storage device of the storage device assembly of FIG. 2. FIG. 6 is a partially enlarged perspective view for describing the storage device of the storage device assembly of FIG. 2. FIGS. 7 and 8 are perspective views for describing an extension kit of the storage device assembly of FIG. 2. FIG. 9 is an exploded perspective view for describing the extension kit of the storage device assembly of FIG. 2.

Referring to FIGS. 2 and 3, a storage device assembly according to some exemplary embodiments may include a storage device 200 and an extension kit 300.

The extension kit 300 (or latch assembly) may be mounted on and dismounted from the storage device 200. For reference, FIG. 2 illustrates a state in which the extension kit 300 is closed by being coupled to the storage device 200, and FIG. 3 illustrates a state in which the extension kit 300 is opened by being separated from the storage device 200. In other words, FIG. 2 illustrates the storage device assembly in a state in which the extension kit 300 is attached to the storage device 200 and FIG. 3 illustrates the storage device assembly in a state in which the extension kit 300 is detached from the storage device 200.

The storage device 200 may include an enclosure 260. Fixing holes FX1 and FX2 may be formed in the enclosure 260. The enclosure 260 may be coupled to the extension kit 300 through the fixing holes FX1 and FX2. This coupling will be described in more detail below with reference to FIGS. 10 to 19. In some exemplary embodiments, the storage device 200 and the extension kit 300 may be mounted on the host 100 (see FIG. 1) in a state of being coupled to each other.

An exterior of the storage device 200 may have, for example, a rectangular parallelepiped shape. In FIGS. 2 and 3, an extending direction of long sides LS of an upper surface (or lower surface) of the storage device 200 is indicated by a first direction X, an extending direction of short sides SS of the upper surface (or lower surface) of the storage device 200 is indicated by a second direction Y, and a thickness direction of the storage device 200 is indicated by a third direction Z. Planes defined by the two directions may be referred to as an XY plane, a YZ plane, and a ZX plane. For example, the upper surface of the storage device 200 may be placed on the XY plane. Unless otherwise specified in the present specification, a shape or exterior of a specific member in a plan view refers to a shape in which the specific member is placed on the XY plane.

For convenience of description, among two base sides of the storage device 200, the base side positioned at one side of the third direction Z (upper side in the drawings) will be referred to as the upper surface, and the base side positioned at the other side of the third direction Z (lower side in the drawings) will be referred to as the lower surface. Furthermore, even in other component members, a base side positioned at one side of the third direction Z will be referred to as an upper surface, and a base side positioned at the other side of the third direction Z will be referred to as a lower surface. However, in the present specification, the terms "upper" and "lower" are merely used to describe relative positions, and even when the terms "upper side" and "lower side" are expressed, the upper side and the lower side may be reversed or may be positioned in a lateral or diagonal direction according to the direction change of the storage device 200.

The exterior of the storage device 200 may be standardized or may follow any form factor. A dimension of the storage device 200 having a rectangular parallelepiped shape may also be changed according to various criteria.

In some exemplary embodiments, the storage device 200 may follow a long type dimension standard in which a length of the long side LS (width in the first direction X) is 119 mm, a length of the short side SS (width in the second direction Y) is 36.5 mm, and a thickness (width in the third direction Z) is 9.5 mm. In addition, in some exemplary embodiments, the storage device 200 may follow a short type dimension standard in which the length of the long side LS (width in the first direction X) is 52 mm, the length of the short side SS (width in the second direction Y) is 36.5 mm, and the thickness (width in the third direction Z) is 9.5 mm. In the dimension standard, a tolerance within 5% of each dimension may be allowed. For example, in the dimension standard, tolerances of ±0.25 mm, ±0.35 mm, ±0.45 mm, and the like may be allowed.

Referring to FIGS. 4 and 5, the storage device 200 of the storage device assembly according to some exemplary embodiments includes a memory module 270 and the enclosure 260 that accommodates the memory module 270.

The enclosure 260 may substantially define the exterior of the storage device 200. The memory module 270 may be covered by the enclosure 260 excluding a portion of a region or the like thereof in which a memory connector MCN is positioned.

The memory module 270 may include a module board BDH, the memory connector MCN provided on at least one end portion of the module board BDH, and electronic elements CHP disposed on at least one surface of the module board BDH.

The module board BDH may include one or more insulating layers and wiring layers. The module board BDH may include, for example, a printed circuit board (PCB).

The module board BDH may have a plate shape. For example, the module board BDH may be approximately placed on the XY plane. An overall planar shape of the module board BDH may be similar to a planar shape of the storage device 200. For example, when the storage device 200 has a rectangular shape or an exterior similar thereto in a plan view, the module board BDH may also have a rectangular shape or an exterior similar thereto.

In a plan view, a size of the module board BDH may be smaller than a size of the storage device 200 but may be close to the size of the storage device 200. For example, an area occupied by the module board BDH may be in a range of 50% to 99% of an area occupied by the storage device 200.

In a plan view, the module board BDH may occupy a central portion of the storage device 200, and each side of the module board BDH may be positioned inside a corresponding side of the storage device 200. Excluding a partial section, the enclosure 260 may be disposed in a space between each side of the module board BDH and each side of the storage device 200, thereby preventing the module board BDH from being exposed to the outside.

The module board BDH may have module coupling holes MH1 to MH4. The module coupling holes MH1 to MH4 may have the same size and shape, but embodiments are not limited thereto. In the present specification, the term "the same" means not only "completely the same" but also encompasses a situation in which a "minute difference" that may occur due to a margin in a production process. While four module coupling holes MH1 to MH4 are illustrated in FIG. 4 by way of example, the number of module coupling holes is not limited to four, and in some embodiments, the number of module coupling holes may be less than four, or more than four.

The module coupling holes MH1 to MH4 may pass through the module board BDH in the third direction Z (thickness direction). The module coupling holes MH1 to MH4 may provide spaces into which coupling members such as screws, screw nails, piece bolts, and/or bolts are inserted. In FIGS. 4 and 5, module screws 130 are illustrated as the coupling members by way of example, but in some embodiments, various coupling members inserted into and coupled to holes or grooves may be similarly applied.

The module coupling holes MH1 to MH4 may be formed in corner portions of the module board BDH. The module coupling holes MH1 to MH4 may include a first module coupling hole MH1 formed in a first corner portion, a second module coupling hole MH2 formed in a second corner portion, a third module coupling hole MH3 formed in a third corner portion, and a fourth module coupling hole MH4 formed in a fourth corner portion. However, this configuration is merely an example, and in some embodiments the module coupling holes MH1 to MH4 may be omitted in some corner portions, and/or in some embodiments, the module coupling holes MH1 to MH4 may be further formed in a region (for example, a central portion or a region adjacent to a side) other than the corner portions.

In some exemplary embodiments, in order to provide an efficient coupling force, the positions of the module coupling holes MH1 to MH4 may be configured such that distances thereof spaced from the corner portions in the first direction X are the same and distances spaced apart from the corner portions in the second direction Y are the same. In some embodiments, when corners of the module board BDH are positioned at vertexes of a rectangle, a figure connecting the module coupling holes MH1 to MH4 may define a rectangle.

In some other exemplary embodiments, the above-described positions of the module coupling holes MH1 to MH4 may be changed according to the wiring configuration of the module board BDH, the arrangement of chips, and/or the position of the memory connector MCN. For example, as shown in FIGS. 4 and 5, when the memory connector MCN is positioned at a first short side SS1 and disposed to be relatively more biased to a second long side LS2 than a first long side LS1, the fourth module coupling hole MH4 may be positioned to be spaced farther apart from the first short side SS1 in the first direction X than the first module coupling hole MH1. In this case, a straight line connecting the first module coupling hole MH1 and the fourth module coupling hole MH4 may be inclined at a first angle with respect to the second direction Y.

In the case of the second module coupling hole MH2 and the third module coupling hole MH3 formed near a second short side SS2 at which the memory connector MCN is not positioned, a spacing distance between the second module coupling hole MH2 and the second short side SS2 in the first direction X may be the same as a spacing distance between the third module coupling hole MH3 and the second short side SS2 in the first direction X. However, when the spacing distance of the second module coupling hole MH2 is configured to be greater than the spacing distance of the third module coupling hole MH3, it is possible to mitigate a deviation in spacing distance between the module coupling holes MH1 to MH4 in the first direction X. For example, a straight line connecting the second module coupling hole MH2 and the third module coupling hole MH3 may be inclined at a second angle with respect to the second direction Y. The absolute value of the second angle may be smaller than the absolute value of the first angle, but embodiments are not limited thereto. In some exemplary embodiments, a figure connecting the module coupling holes MH1 to MH4 may define a trapezoid.

Each of the module coupling holes MH1 to MH4 may form a circular closed curve in a plan view. In this case, the module coupling holes MH1 to MH4 may be completely surrounded by the module board BDH in a plan view. In some exemplary embodiments, one or more of the module coupling holes MH1 to MH4 may be open at one side (for example, the first long side LS1 or the second long side LS2) of the module board BDH. The module coupling holes MH1 to MH4 may be formed to be closer to the sides of the module board BDH, and the sides of the module board BDH may be disposed in imaginary circles formed by the module coupling holes MH1 to MH4. As a result, the module coupling holes MH1 to MH4 may not complete circular closed curves and may be horizontally open at the sides of the module board BDH. Even in this case, a width of a portion of the module coupling hole open at the side of the module board BDH may be smaller than a diameter of the imaginary circle.

The memory connector MCN may be disposed at one end portion of the module board BDH. Although FIGS. 4 and 5 illustrates only a case in which the memory connector MCN is connected to the first short side SS1 of the module board BDH and protrudes outward from the first short side SS1 of the module board BDH in the first direction X, this configuration is merely an example, and in some embodiments the memory connector MCN may be disposed at another side or may be disposed at the plurality of sides.

In some exemplary embodiments, a width of the memory connector MCN in the second direction Y may be smaller than a width of the module board BDH in the second direction Y. In addition, the memory connector MCN may be disposed to be spaced apart from an extension line of the first long side LS1 and/or an extension line of the second long side LS2 of the module board BDH. The memory connector MCN may be disposed to be relatively more biased to the second long side LS2 than the first long side LS1. That is, a distance between the memory connector MCN and the extension line of the first long side LS1 of the module board BDH may be greater than a distance between the memory connector MCN and the extension line of the second long side LS2 of the module board BDH. However, exemplary embodiments are not limited thereto, and in some embodiments, the memory connector MCN may be equidistant from the long sides of the module board BDH.

The memory connector MCN may be connected to the module board BDH. The memory connector MCN may be provided as a member separate from the module board BDH and attached to the module board BDH or, in some embodiments, may be provided to be integrated with the module board BDH. When the memory connector MCN is provided to be integrated with the module board BDH, the memory connector MCN may be provided in a protrusion region of the module board BDH in which a portion of the module board BDH protrudes outward.

The memory connector MCN may include a plurality of connection terminals EL. The plurality of connection terminals EL may be arranged to be spaced apart from each other in the second direction Y. The connection terminals EL of the memory connector MCN may be connected to connection terminals of a corresponding host connector (not shown) and connected to the host 100 (see FIG. 1).

The connection terminals EL of the memory connector MCN may be connected to wires of the module board BDH. When the memory connector MCN is provided to be integrated with the module board BDH, the connection terminal EL of the memory connector MCN may be formed to be coplanar with the wire of the module board BDH using the same material as the wire of the module board BDH. Each of the connection terminals EL may have a shape of a pad electrode that is wider than the wire of the module board BDH. The plurality of connection terminals EL may be exposed to the outside without being at least partially covered by the insulating layer.

The plurality of connection terminals EL may be disposed on an upper surface or a lower surface of the memory connector MCN. In some cases, the plurality of connection terminals EL may be disposed on both the upper and lower surfaces of the memory connector MCN. Furthermore, the memory connector MCN may include a plurality of layers separated in a thickness direction thereof, and the plurality of connection terminals EL may be disposed on at least one surface of each of the layers.

The size, shape, and position of the memory connector MCN and the arrangement of the connection terminals EL may follow standards. The standards may be predetermined. For example, the size, shape, and position of the memory connector MCN and the arrangement of the connection terminals EL may correspond to standards such as E1.S, M.2, and NF2.

The electronic elements CHP may be disposed on an upper surface and/or a lower surface of the module board BDH. The electronic element CHP may be manufactured in the form of a chip separate from the module board BDH and mounted on the module board BDH.

The electronic elements CHP may include a semiconductor element. The semiconductor element may include a memory such as a NAND flash memory or a dynamic random access memory (DRAM) and a memory controller that controls the memory. In some exemplary embodiments, the storage controller 210, the host interface 211, the memory interface 212, the CPU 213, and the buffer memory 216 shown in FIG. 1 may be manufactured in the form of the electronic element CHP and mounted on the module board BDH. In some exemplary embodiments, the electronic elements CHP may further include a capacitor element. Each of the electronic elements CHP may be connected to the wire of the module board BDH to perform an electrical operation. The plurality of electronic elements CHP may be spaced apart from each other. A horizontal gap may be defined in a spacing space between the electronic elements CHP. The horizontal gap may be filled, for example, with air.

The enclosure 260 may have an overall hollow rectangular parallelepiped shape. The memory module 270 may be disposed in the enclosure 260. That is, the enclosure 260 may function as a housing that accommodates the memory module 270.

The enclosure 260 may include an exterior having an upper surface, a lower surface, and side surfaces. The upper and lower surfaces of the enclosure 260 may constitute the upper and lower surfaces of the storage device 200, and the side surfaces thereof constitute side surfaces of the storage device 200. At a position corresponding to one side surface of the storage device 200, the enclosure 260 may have a connector opening COP exposing the memory connector MCN in the first direction X.

In some exemplary embodiments, the enclosure 260 may be provided by assembling a plurality of components. For example, the enclosure 260 may include an upper enclosure 261 positioned at an upper side and a lower enclosure 262 positioned at a lower side. The upper enclosure 261 and the lower enclosure 262 may be coupled to each other to define an at least partially sealed space. The memory module 270 may be accommodated in the sealed space.

The upper enclosure 261 and the lower enclosure 262 may each be made of a metal such as stainless steel, aluminum (Al), copper (Cu), titanium (Ti), nickel (Ni), or an alloy thereof or may each be made of a polymer material, a carbon-based material, or a composite material composed of a combination thereof.

In some exemplary embodiments, the upper enclosure 261 and the lower enclosure 262 may include a thermal interface material (TIM), a phase change material (PCM), or an encapsulated PCM (ePCM). The materials may be mixed into the structural materials of the upper enclosure 261 and the lower enclosure 262 and may be applied on inner surfaces of the upper enclosure 261 and the lower enclosure 262 (for example, a lower surface of the upper enclosure 261 and an upper surface of the lower enclosure 262) or both surfaces thereof. In some embodiments, the materials may be manufactured into a separate film or the like and attached to the inner surfaces or both surfaces of the upper enclosure 261 and the lower enclosure 262.

The TIM or the like may assist the upper enclosure 261 and the lower enclosure 262 in absorbing, storing, or spreading heat. Accordingly, it is possible to increase the thermal capacity of the enclosure 260 and the storage device 200 including the enclosure 260. The materials of the upper enclosure 261 and the lower enclosure 262 may be the same or different.

The upper enclosure 261 may include an upper plate CVU that is an upper cover and a first sidewall ESW1 and a second sidewall ESW2 that are side covers.

The upper plate CVU may be placed on the XY plane. In some exemplary embodiments, the upper plate CVU may have a uniform thickness. The upper plate CVU may have a substantially rectangular shape in a plan view. A planar shape of the upper plate CVU may be substantially the same as the planar shape of the storage device 200. Lengths of the long sides LS and the short sides SS of the storage device 200 may be determined by lengths of long sides LS1 and LS2 and short sides SS1 and SS2 of the upper plates CVU, respectively.

In some exemplary embodiments, the upper plate CVU may cover not only the module board BDH of the memory module 270 but also the memory connector MCN of the memory module 270. A first short side SS1 of the upper plate CVU may be aligned with an end of the memory connector MCN or may be disposed outside the memory connector MCN.

The first sidewall ESW1 and the second sidewall ESW2 may be connected to and integrally formed with the upper plate CVU. The first sidewall ESW1 may be bent from the first long side LS1 of the upper plate CVU to extend in the third direction Z, and the second sidewall ESW2 may be bent from the second long side LS2 of the upper plate CVU to extend in the third direction Z. The first sidewall ESW1 and the second sidewall ESW2 may have the same thickness, but embodiments are not limited thereto. The first sidewall ESW1 and the second sidewall ESW2 may have a height corresponding to a height of the storage device 200. In some exemplary embodiments, the first sidewall ESW1 and the second sidewall ESW2 may have the same overall height.

In some exemplary embodiments, in order to define the connector opening COP, a sidewall may not be present at the first short side SS1 of the upper plate CVU.

The upper enclosure 261 may have coupling grooves CPG that are spatially connected to the module coupling holes MH1 to MH4 and coupled through the module screws 130. The number of the coupling grooves CPG of the upper enclosure 261 may be the same as that of the module coupling holes MH1 to MH4. The coupling grooves CPG of the upper enclosure 261 may overlap the module coupling holes MH1 to MH4 corresponding thereto. The coupling grooves CPG of the upper enclosure 261 and the module coupling holes MH1 to MH4 may have the same planar shape, but embodiments are not limited thereto.

The upper plate CVU of the upper enclosure 261 may include an extension part EXP extending in the first direction X further than one end of the first sidewall ESW1 and one end of the second sidewall ESW2. Due to the extension part EXP, the upper plate CVU may extend in the first direction X further than the first sidewall ESW1 and the second sidewall ESW2. The fixing holes FX1 and FX2 coupled to the extension kit 300 (see FIGS. 2 and 3) may be formed in the extension part EXP. The fixing holes FX1 and FX2 may each extend, for example, in the third direction Z to pass through the extension part EXP.

In some exemplary embodiments, the upper enclosure 261 may further include at least one clamping hole passing through the upper plate CVU. When the storage device 200 is coupled to a host connector (not shown) corresponding thereto so as to be connected to the host 100 (see FIG. 1), the clamping hole may provide a space into which a hook of a latch of the host connector is inserted. For example, the clamping hole may be formed adjacent to the first short side SS1 of the upper plate CVU. As an example, the clamping hole may be formed at a position overlapping the memory connector MCN. The number of the clamping holes may depend on the host connector corresponding thereto. For example, when the host connector includes two hooks, the number of the clamping holes may also be two. However, this configuration is only an example and, in some embodiments, the number of clamping holes and hooks may be less than or more than two.

The lower enclosure 262 may include a lower plate CVB that is a lower cover.

The lower plate CVB may be placed on the XY plane. The lower plate CVB may have the same thickness as the upper plate CVU, but embodiments are not limited thereto. In some exemplary embodiments, the lower plate CVB may have an area smaller than that of the upper plate CVU. In some exemplary embodiments, the lower plate CVB may cover the entirety of the module board BDH of the memory module 270 from below and may expose the memory connector MCN without covering the memory connector MCN. A first short side SS1 of the lower plate CVB may be positioned inside the first short side SS1 of the upper plate CVU and may be positioned inside the end of the memory connector MCN. The first short side SS1 of the upper plate CVU may be aligned with the first short side SS1 of the module board BDH, but embodiments are not limited thereto.

The lower enclosure 262 may include coupling holes CPH that are spatially connected to the module coupling holes MH1 to MH4 and coupled through the module screws 130. The number of the coupling holes CPH of the lower enclosure 262 may be the same as that of the module coupling holes MH1 to MH4. The coupling holes CPH of the lower enclosure 262 may overlap the module coupling holes MH1 to MH4 corresponding thereto and the coupling grooves CPG of the upper enclosure 261. The coupling holes CPH of the lower enclosure 262 and the module coupling holes MH1 to MH4 may be the same planar shape, but embodiments are not limited thereto.

The upper enclosure 261, the memory module 270, and the lower enclosure 262 may be coupled to each other through the module screws 130 each including a screw body and a screw head. The module screws 130 may sequentially pass through the coupling holes CPH and the corresponding module coupling holes MH1 to MH4 from a lower surface of the lower enclosure 262 to be inserted into the corresponding coupling grooves CPG, thereby coupling the upper enclosure 261, the memory module 270, and the lower enclosure 262 to each other. In order to facilitate coupling through the module screws 130, threads rotating in the same direction may be disposed on inner walls of the coupling holes CPH, the module coupling holes MH1 to MH4, and/or the coupling grooves CPG. In the coupled storage device 200, a head of the module screw 130 may be disposed under the lower enclosure 262 or may be disposed inside the coupling hole CPH of the lower enclosure 262.

Referring to FIG. 6, in the storage device of the storage device assembly according to some exemplary embodiments, the fixing holes FX1 and FX2 may each include a through-hole portion TRH disposed at a central portion thereof and an expansion hole portion ENH disposed on the through-hole portion TRH to surround the through-hole portion TRH. The through-hole portion TRH and the expansion hole portion ENH may be spatially connected to each other. The through-hole portion TRH and the expansion hole portion ENH may be coaxial.

In some exemplary embodiments, the through-hole portion TRH may form a circular closed curve in a plan view. The expansion hole portion ENH may have an inner diameter greater than that of the through-hole portion TRH, and the through-hole portion TRH may be disposed in the expansion hole portion ENH in a plan view. For example, the through-hole portion TRH may have a first inner diameter C1 in the second direction Y, and the expansion hole portion ENH may have a second inner diameter C2 that is greater than the first inner diameter C1 in the second direction Y. Accordingly, at a boundary between the through-hole portion TRH and the expansion hole portion ENH, the expansion hole portion ENH may have a bottom surface placed on the XY plane. In some exemplary embodiments, the lower surface of the expansion hole portion ENH may function as a seating surface on which a first locking portion 338 or a second locking portion 339 of the extension kit 300 (see FIGS. 2 and 3) described below is seated.

In some exemplary embodiments, the first inner diameter C1 of the through-hole portion TRH may be in a range of about 2.6 mm to 2.8 mm. In addition, a first depth D1 of the through-hole portion TRH may be in a range of about 0.9 mm to 1.1 mm. In some exemplary embodiments, the second inner diameter C2 of the expansion hole portion ENH may be in a range of about 4.6 mm to 4.8 mm. In addition, a second depth D2 of the expansion hole portion ENH may be in a range of about 1.1 mm to 1.3 mm.

In some exemplary embodiments, one or more of the expansion hole portions ENH may be open toward the side of the enclosure 260. For example, the expansion hole portion ENH may extend to the second short side SS2 of the enclosure 260. Accordingly, the expansion hole portion ENH may not complete a circular closed curve shape and may be open at the side of the enclosure 260 in a horizontal direction. Although a width of a portion of the expansion hole portion ENH open at the side of the enclosure 260 is only illustrated as being the same as the second inner diameter C2 of the expansion hole portion ENH, this configuration is merely an example, and in some embodiments, the width of the portion of the expansion hole portion ENH may be different from the second inner diameter C2.

Referring to FIGS. 7 to 9, the extension kit 300 of the storage device assembly according to some exemplary embodiments may include a case 310, a locking lever 330, a handle 350, a handle locker 370, and a first optical cable 392 and a second optical cable 394.

The case 310 may have an overall hollow rectangular parallelepiped shape. The case 310 may provide a space for arranging the locking lever 330, the handle 350, the handle locker 370, and the first and second optical cables 392 and 394 which are to be described below. That is, the case 310 may function as a housing.

For example, the case 310 may have an upper wall 310U and a lower wall 310L that are each placed on the XY plane and face each other. In addition, the case 310 may have a first sidewall 310S1 and a second sidewall 310S2 that are each placed on the ZX plane and face each other. In addition, the case 310 may have a front surface 310F and a rear surface 310B opposite to each other. The front surface 310F and the rear surface 310B may each be placed on the YZ plane. In some exemplary embodiments, the front surface 310F of the case 310 may face the storage device 200 (see FIGS. 2 and 3).

The case 310 may have an interior space 312 extending in the first direction X (best seen in FIG. 9). The interior space 312 may be defined by, for example, the upper wall 310U, the lower wall 310L, the first sidewall 310S1, and the second sidewall 310S2.

In some embodiments, the case 310 may include a first protruding pin 316 and a second protruding pin 317. The first and second protruding pins 316 and 317 may protrude from a surface of the case 310 to extend in the third direction Z. For example, the first and second protruding pins 316 and 317 may protrude from an upper surface of the case 310 to extend in the third direction Z.

The first and second protruding pins 316 and 317 may guide the extension kit 300 to the storage device 200 (see FIGS. 2 and 3). For example, the first and second protruding pins 316 and 317 of the extension kit 300 may be inserted into the fixing holes FX1 and FX2 of the enclosure 260, respectively.

In some exemplary embodiments, the case 310 may have a plurality of air holes 311. Each of the air holes 311 may extend in the first direction X. Although the air holes 311 are only illustrated as being formed in a front surface 310F of the case 310, this configuration is merely an example. In some embodiments, positions at which the air holes 311 are formed may vary.

The locking lever 330 may be disposed on the case 310. The locking lever 330 may be supported by the case 310 to be rotatable, and the extension kit 300 may be provided to be mountable on and dismountable from the storage device 200. In some exemplary embodiments, the locking lever 330 may include a lever portion 334, a plate portion 332, an arm portion 336, and the first and second locking portions 338 and 339 (best seen in FIG. 9).

The lever portion 334 may be supported by the case 310 to be rotatable with respect to the case 310. For example, the lever portion 334 may be rotatable about a first rotation axis AX1 extending in the second direction Y. In some exemplary embodiments, the lever portion 334 may be disposed in the interior space 312 of the case 310.

In some embodiments, the lever portion 334 may be elastically rotatable. For example, first elastic members 340 and 345 may be disposed in the interior space 312 of the case 310 to elastically connect the case 310 and the lever portion 334. The first elastic members 340 and 345 may be configured such that the lever portion 334 is supported by the case 310 so as to be elastically rotatable.

For example, the case 310 may have a first pinhole 310T1 extending in the second direction Y, and the lever portion 334 may have a lever hole 344T extending in the second direction Y. In addition, the first elastic members 340 and 345 may include a first fixing pin 340 and a first spring 345. The first fixing pin 340 may extend in the second direction Y to be sequentially inserted into the lever hole 344T and the first pinhole 310T1. Accordingly, the first fixing pin 340 may support the lever portion 334 on the case 310. The first spring 345 may be wound around the first fixing pin 340. Accordingly, the first spring 345 may elastically rotate the lever portion 334 around the first rotation axis AX1.

The plate portion 332 may extend from the lever portion 334. The plate portion 332 may have a plate shape. For example, when the locking lever 330 is in a closed state (as illustrated for example in FIG. 2 or FIGS. 14-19), the plate portion 332 may be placed on the XY plane. The plate portion 332 may be exposed at the case 310. For example, the upper wall 310U of the case 310 may have a first opening 314 (best seen in FIG. 8). The plate portion 332 may be disposed in the first opening 314 of the case 310 and exposed at the upper surface of the case 310. As the lever portion 334 rotates, the plate portion 332 may also rotate. In some exemplary embodiments, the plate portion 332 may be provided to be integrated with the lever portion 334.

The arm portion 336 may extend from the plate portion 332. The arm portion 336 may be closer to the front surface 310F of the case 310 than the plate portion 332. For example, the arm portion 336 may extend in the second direction Y from one end of the plate portion 332 adjacent to the front surface 310F of the case 310. In some exemplary embodiments, the arm portion 336 may be exposed at the upper surface of the case 310. As the plate portion 332 rotates, the arm portion 336 may also rotate. In some exemplary embodiments, the arm portion 336 may be provided to be integrated with the plate portion 332. In some exemplary embodiments, the arm portion 336 may be disposed to be coplanar with the plate portion 332.

Although the arm portion 336 is only illustrated as extending from the first sidewall 310S1 of the case 310 to the second sidewall 310S2 of the case 310, this is merely an example. In some embodiments, a length of the arm portion 336 extending in the second direction Y may be shorter or longer than that shown in the drawings.

The first and second locking portions 338 and 339 may extend from the arm portion 336. The first and second locking portions 338 and 339 may be closer to the front surface 310F of the case 310 than the arm portion 336. For example, the first and second locking portions 338 and 339 may protrude from the arm portion 336 toward the front surface 310F of the case 310. That is, the plate portion 332 may extend from one side of the arm portion 336, and the first and second locking portions 338 and 339 may extend from the other side of the arm portion 336. In some exemplary embodiments, the first and second locking portions 338 and 339 may be exposed at the upper surface of the case 310. As the arm portion 336 rotates, the first and second locking portions 338 and 339 may also rotate. In some exemplary embodiments, the first and second locking portions 338 and 339 may be provided to be integrated with the arm portion 336. In some exemplary embodiments, the first and second locking portions 338 and 339 may be disposed to be coplanar with the arm portion 336.

In some exemplary embodiments, the first elastic members 340 and 345 may apply a restoring force to the locking lever 330 such that the first and second locking portions 338 and 339 face the case 310. For example, the first elastic members 340 and 345 may apply a restoring force to the locking lever 330 such that the first and second locking portions 338 and 339 face the upper wall 310U of the case 310.

The first and second locking portions 338 and 339 may extend from the arm portion 336 so as to correspond to the fixing holes FX1 and FX2, respectively, (see FIG. 3) of the storage device 200. Accordingly, the locking lever 330 may mount or dismount the extension kit 300 to or from the storage device 200. This operation will be described in more detail below with reference to FIGS. 10 to 19.

In some exemplary embodiments, the shape of the first and second locking portions 338 and 339 may correspond to the expansion hole portions ENH (see FIG. 6) of the fixing holes FX1 and FX2 in a plan view. However, embodiments are not limited thereto, and in some embodiments, the shape of the first and second locking portions 338 and 339 may be different from the shape of the expansion hole portions ENH (see FIG. 6) of the fixing holes FX1 and FX2. In some embodiments, the shape and number of the first and second locking portions 338 and 339 may vary. For example, while two locking portions are illustrated in FIGS. 7-9, in some embodiments, only one locking portion may be provided. In other embodiments, more than two locking portions may be provided. In such cases, similarly the number of protruding pins and the number of fixing holes may be varied to correspond with the number of locking portions.

In some exemplary embodiments, the first and second locking portions 338 and 339 may be disposed on the first and second protruding pins 316 and 317, respectively. For example, the first locking portion 338 may be disposed on the first protruding pin 316, and the second locking portion 339 may be disposed on the second protruding pin 317. In some exemplary embodiments, when the locking lever 330 is in a closed state, the first and second locking portions 338 and 339 may be in contact with the first and second protruding pins 316 and 317, respectively. In some exemplary embodiments, the first elastic members 340 and 345 may apply a restoring force to the locking lever 330 such that the first and second locking portions 338 and 339 face the first and second protruding pins 316 and 317. In other words, the first elastic members 340 and 345 may apply a restoring force to the locking lever 330 such that the first and second locking portions 338 and 339 engage the first and second protruding pins 316 and 317

Although one plate portion 332 extending from the lever portion 334 and/or the arm portion 336 is illustrated, this configuration is merely an example. In some embodiments, a plurality of plate portions 332 may extend from one side of the arm portion 336.

Although the plate portion 332 extending from the lever portion 334 and/or the arm portion 336 is illustrated as being more adjacent to the first sidewall 310S1 of the case 310 than the second sidewall 310S2 of the case 310, this configuration is merely an example. In some embodiments, the plate portion 332 may be closer to the second sidewall 310S2 of the case 310 than the first sidewall 310S1 of the case 310, or in some embodiments, a spacing distance between the plate portion 332 and the first sidewall 310S1 of the case 310 may be the same as a distance between the plate portion 332 and the second sidewall 310S2 of the case 310.

The handle 350 may be disposed on the case 310. The handle 350 may be supported by the case 310 to be rotatable and may be configured to support the locking lever 330. In some exemplary embodiments, the handle 350 may include a first rotation portion 352 and a first support portion 354.

The first rotation portion 352 may be supported by the case 310 to be rotatable. For example, the first rotation portion 352 may be rotatable about a second rotation axis AX2 extending in the third direction Z. In some exemplary embodiments, the first rotation portion 352 may be disposed in the interior space 312 of the case 310 adjacent to the second sidewall 310S2.

In some exemplary embodiments, the first rotation portion 352 may be elastically rotatable. For example, second elastic members 360 and 365 may be disposed in the interior space 312 of the case 310 to elastically connect the case 310 and the first rotation portion 352. The second elastic members 360 and 365 may be configured such that the first rotation portion 352 is supported by the case 310 so as to be elastically rotatable.

For example, the case 310 may have a second pinhole 310T2 extending in the third direction Z. In addition, the second elastic members 360 and 365 may include a second fixing pin 360 and a second spring 365. The second fixing pin 360 may extend in the second direction Y to be sequentially inserted into the first rotation portion 352 and the second pinhole 310T2. Accordingly, the second fixing pin 360 may support the first rotation portion 352 on the case 310. The second spring 365 may be wound around the second fixing pin 360. Accordingly, the second spring 365 may elastically rotate the first rotation portion 352 around the second rotation axis AX2. In some exemplary embodiments, the second elastic members 360 and 365 may apply a restoring force to the handle 350 such that the first support portion 354 moves in a direction away from the rear surface 310B of the case 310.

The first support portion 354 may extend from the first rotation portion 352. The first support portion 354 may be disposed on the rear surface 310B of the case 310. When the locking lever 330 is in a closed state (as illustrated for example in FIG. 2, the first support portion 354 may support the locking lever 330. This configuration will be described in more detail below with reference to FIGS. 10 to 19.

In some exemplary embodiments, the handle 350 may further include a first coupling protrusion 358. The first coupling protrusion 358 may protrude from, for example, the first rotation portion 352. As the handle 350 rotates about the second rotation axis AX2, the first coupling protrusion 358 may protrude from the case 310. For example, the second sidewall 310S2 of the case 310 may have a second opening 313 (best seen in FIG. 7). The first coupling protrusion 358 may be disposed in the second opening 313 and may be exposed at the second sidewall 310S2 of the case 310. As the handle 350 rotates about the second rotation axis AX2, the first coupling protrusion 358 may protrude from the second sidewall 310S2 of the case 310.

The first coupling protrusion 358 may contribute to mounting or dismounting the extension kit 300 on or from a server (not shown) or the like in which the extension kit 300 is disposed. For example, the first coupling protrusion 358 protruding from the second sidewall 310S2 of the case 310 may be coupled to the server or the like in which the extension kit 300 is disposed.

The handle locker 370 may be disposed on the case 310. The handle locker 370 may be provided to be coupled to the handle 350. In some exemplary embodiments, the handle locker 370 may include a second support portion 374.

The second support portion 374 may be disposed on the rear surface 310B of the case 310. The handle 350 may be rotated to be mounted to and detached from the second support portion 374. For example, the handle 350 may further include a second coupling protrusion 356 protruding from the first support portion 354. The second support portion 374 may have a coupling groove 376 corresponding to the second coupling protrusion 356. As the handle 350 rotates about the second rotation axis AX2, the second coupling protrusion 356 may be coupled to the coupling groove 376 or separated from the coupling groove 376. This operation will be described in more detail below with reference to FIGS. 10 to 19.

In some exemplary embodiments, the handle locker 370 may be supported by the case 310 to be rotatable. For example, the handle locker 370 may further include a second rotation portion 372 that is supported by the case 310 to be rotatable. The second rotation portion 372 may be rotatable about a third rotation axis AX3 that is spaced apart from the second rotation axis AX2 and extends in the third direction Z. The second support portion 374 may extend from the second rotation portion 372. In some exemplary embodiments, the second rotation portion 372 may be spaced apart from the first rotation portion 352 and may be disposed in the interior space 312 of the case 310 adjacent to the first sidewall 310S1.

In some exemplary embodiments, the second rotation portion 372 may be elastically rotatable. For example, third elastic members 380 and 385 may be disposed in the interior space 312 of the case 310 to elastically connect the case 310 and the second rotation portion 372. The third elastic members 380 and 385 may be configured such that the second rotation portion 372 is supported by the case 310 so as to be elastically rotatable.

For example, the case 310 may have a third pinhole 310T3 extending in the third direction Z. In addition, the third elastic members 380 and 385 may include a third fixing pin 380 and a third spring 385. The third fixing pin 380 may extend in the third direction Z to be sequentially inserted into the second rotation portion 372 and the third pinhole 310T3. Accordingly, the third fixing pin 380 may support the second rotation portion 372 on the case 310. The third spring 385 may be wound around the third fixing pin 380. Accordingly, the third spring 385 may elastically rotate the second rotation portion 372 around the third rotation axis AX3. In some exemplary embodiments, the third elastic members 380 and 385 may apply a restoring force to the handle locker 370 such that the second support portion 374 faces the handle 350.

The first and second optical cables 392 and 394 may be disposed in the interior space 312 of the case 310. That is, the case 310 may function as a housing that accommodates the first and second optical cables 392 and 394. The first and second optical cables 392 and 394 may be supported by the case 310 and may extend in the first direction X. For example, a cable support 390 supported by the case 310 may be disposed in the interior space 312 of the case 310. The first and second optical cables 392 and 394 may be disposed on the cable support 390. For example, the first optical cable 392 may be disposed on an upper surface of the cable support 390, and he second optical cable 394 may be disposed on a lower surface of the cable support 390.

The first and second optical cables 392 and 394 may be connected to the storage device 200 to provide an optical signal to the server or the like in which the extension kit 300 is disposed. For example, the first and second optical cables 392 and 394 may include light-emitting diodes (LEDs), but embodiments are not limited thereto.

FIGS. 10 to 19 are views for describing a connection of the storage device assembly according to some exemplary embodiments.

Figure 10:
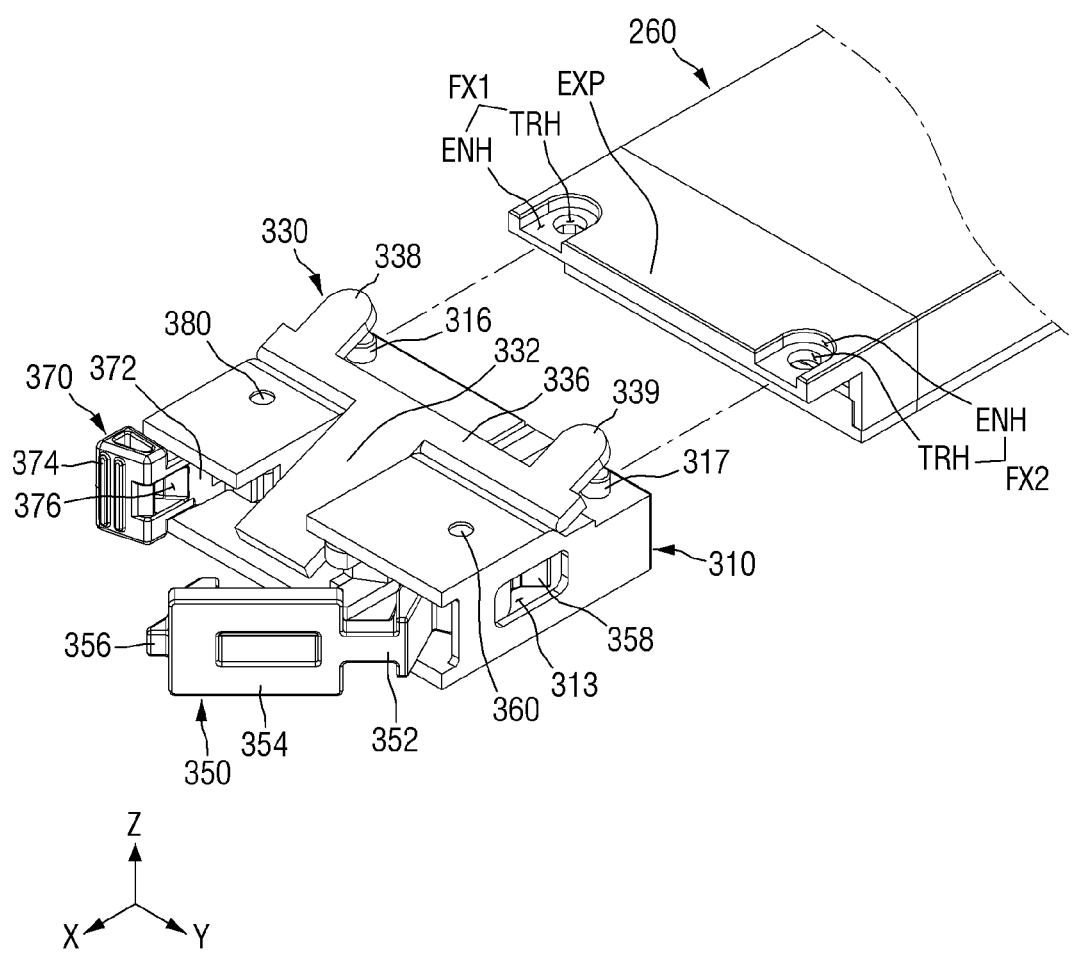
FIGS. 10 to 19 are views for describing a connection of the storage device assembly according to some exemplary embodiments.

Referring to FIG. 10, the locking lever 330 in an open state is provided to the enclosure 260.

For example, the handle 350 may be separated from the handle locker 370. Subsequently, the locking lever 330 may rotate such that the first and second locking portions 338 and 339 move in a direction away from the case 310. For example, a user may apply a force to the plate portion 332 such that the plate portion 332 of the locking lever 330 faces the lower wall 310L of the case 310. Accordingly, the locking lever 330 may rotate against a restoring force of the first elastic members 340 and 345, and the first and second locking portions 338 and 339 of the locking lever 330 may be spaced apart from the upper wall 310U of the case 310.

In some exemplary embodiments, the extension kit 300 in an open state may be attached to the storage device 200 so as to be arranged along the enclosure 260 in the first direction X.

Figure 11:
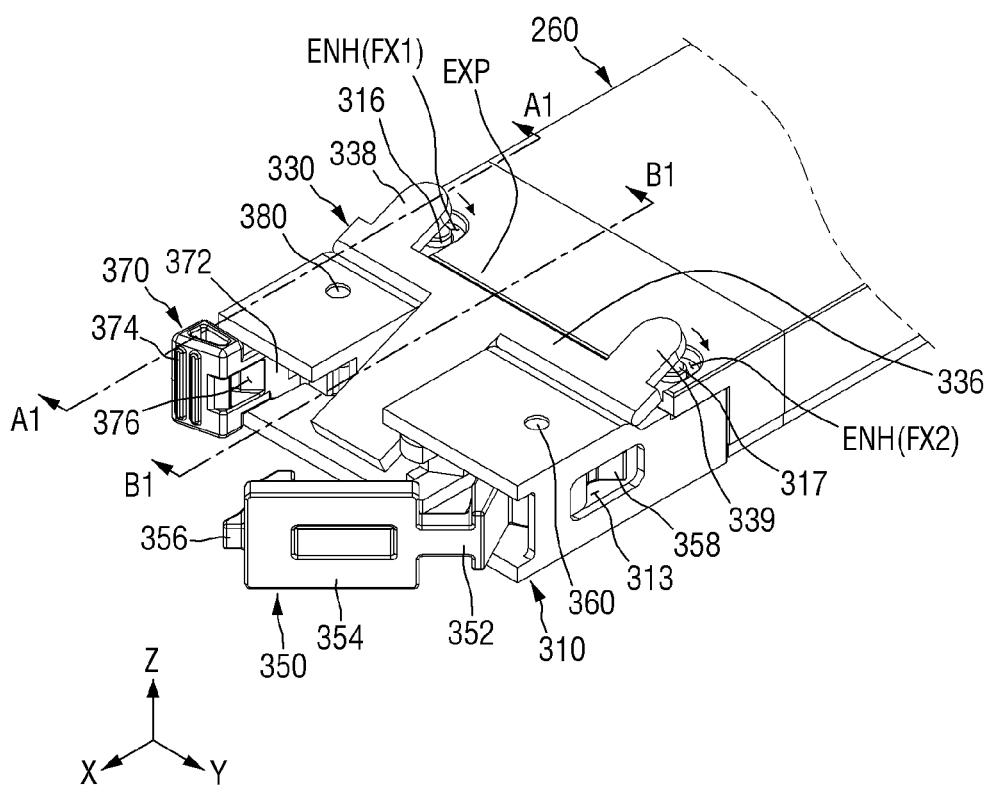
Figure 12:
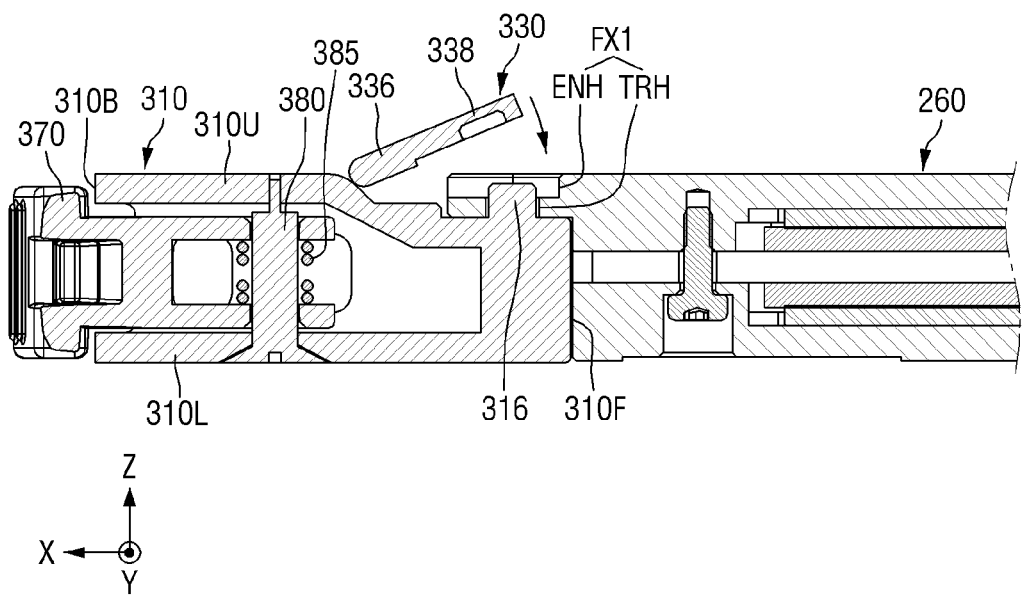
Figure 13:
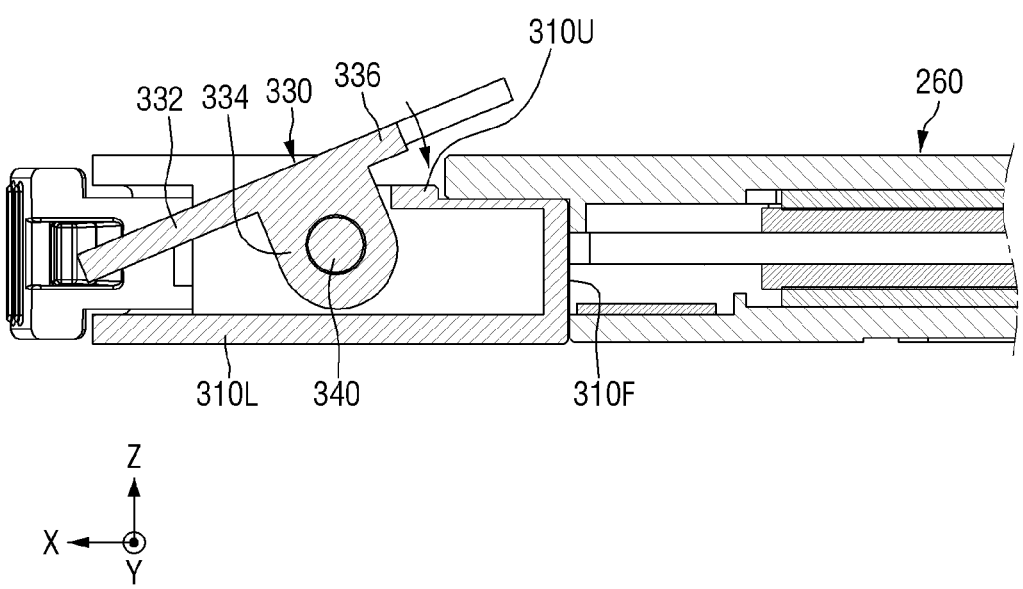

Referring to FIGS. 11 to 13, the first and second protruding pins 316 and 317 of the extension kit 300 are inserted into the first and second fixing holes FX1 and FX2 of the enclosure 260, respectively. For reference, FIG. 12 is a cross-sectional view taken along line A1-A1 of FIG. 11, and FIG. 13 is a cross-sectional view taken along line B1-B1 of FIG. 11.

For example, the first protruding pin 316 may be inserted into the first fixing hole FX1, and the second protruding pin 317 may be inserted into the second fixing hole FX2. Accordingly, when the extension kit 300 is coupled to the storage device 200, the case 310 may be guided into the enclosure 260.

In some embodiments, the first and second protruding pins 316 and 317 may pass through the through-hole portions TRH of the first and second fixing holes FX1 and FX2, respectively, and one end portions of the first and second protruding pins 316 and 317 may be disposed in the expansion hole portions ENH of the first and second fixing holes FX1 and FX2, respectively.

Figure 14:
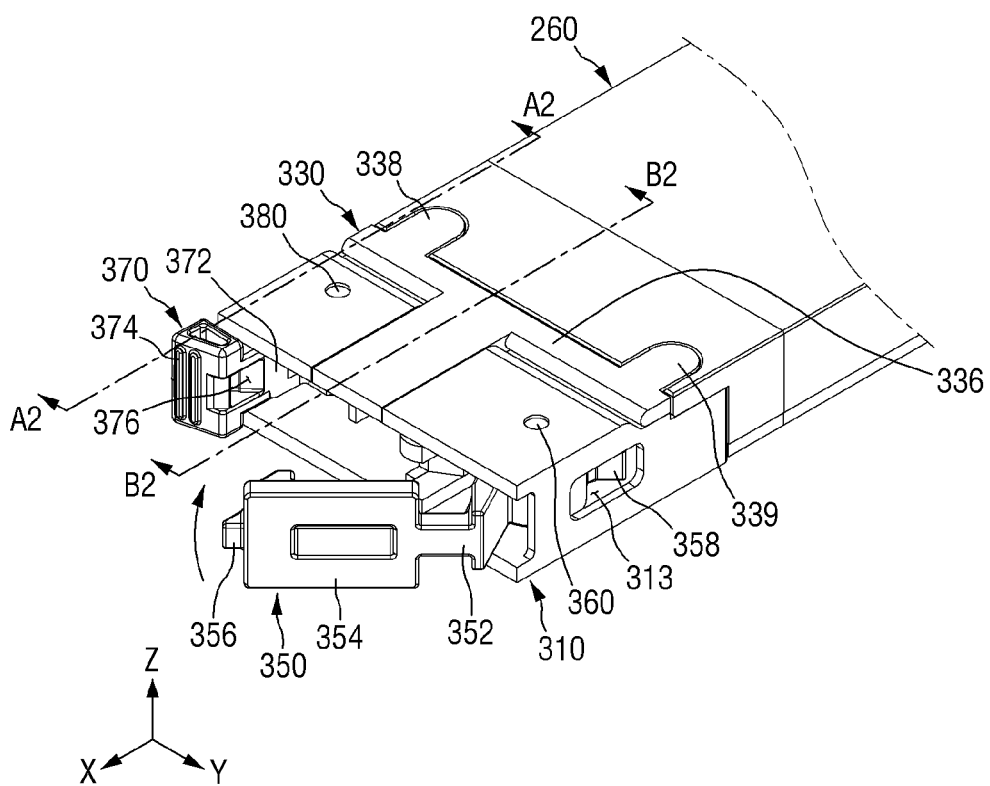
Figure 15:
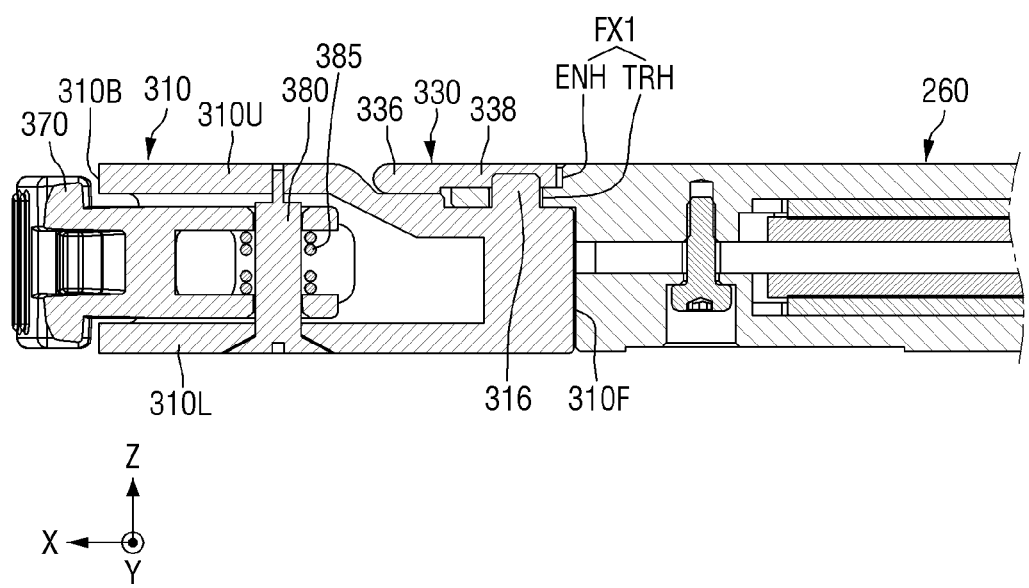
Figure 16:
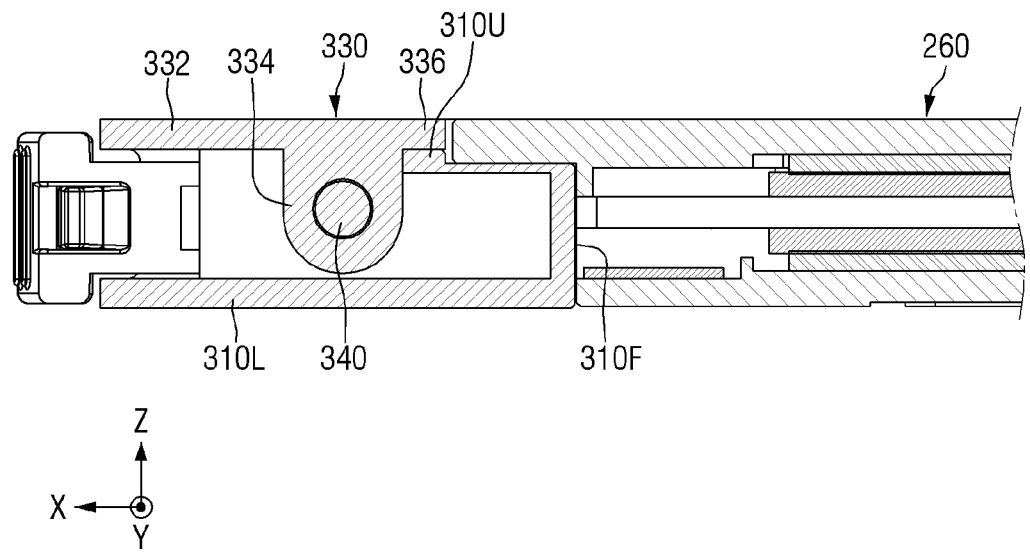

Referring to FIGS. 14 to 16, the locking lever 330 is closed. For reference, FIG. 15 is a cross-sectional view taken along line A2-A2 of FIG. 14, and FIG. 16 is a cross-sectional view taken along line B2-B2 of FIG. 14.

For example, the user may remove a force applied to the plate portion 332 of the locking lever 330. Accordingly, the locking lever 330 may be rotated by a restoring force of the first elastic members 340 and 345, and the first and second locking portions 338 and 339 of the locking lever 330 may face the upper wall 310U of the case 310.

In some exemplary embodiments, in the closed position, the first and second locking portions 338 and 339 may be disposed in the expansion hole portions ENH of the first and second fixing holes FX1 and FX2, respectively. For example, the first locking portion 338 may be disposed in the expansion hole portion ENH of the first fixing hole FX1, and the second locking portion 339 may be disposed in the expansion hole portion of the second fixing hole FX2. That is, the locking lever 330 in a closed state may be provided. The locking lever 330 in a closed state may be coupled to the enclosure 260 together with the first and second protruding pins 316 and 317 of the case 310. Accordingly, the extension kit 300 may be coupled to the storage device 200.

Although the entireties of the first and second locking portions 338 and 339 are illustrated as being disposed in the expansion hole portions ENH of the first and second fixing holes FX1 and FX2 when the locking lever 330 is in a closed state, embodiments are not limited thereto. For example, in some embodiments, when the locking lever 330 is in a closed state, only portions of the first and second locking portions 338 and 339 may be disposed on the upper surface of the enclosure 260.

In some exemplary embodiments, when the locking lever 330 is in a closed state, the first and second locking portions 338 and 339 may be in contact with the first and second protruding pins 316 and 317, respectively. For example, the first locking portion 338 may be in contact with the first protruding pin 316, and the second locking portion 339 may be in contact with the second protruding pin 317.

In some embodiments, when the locking lever 330 is in a closed state, the arm portion 336 may be in contact with the upper wall 310U of the case 310. For example, the upper wall of the case 310 may define a limit at which the locking lever 330 is rotated by a restoring force of the first elastic members 340 and 345.

Figure 17:
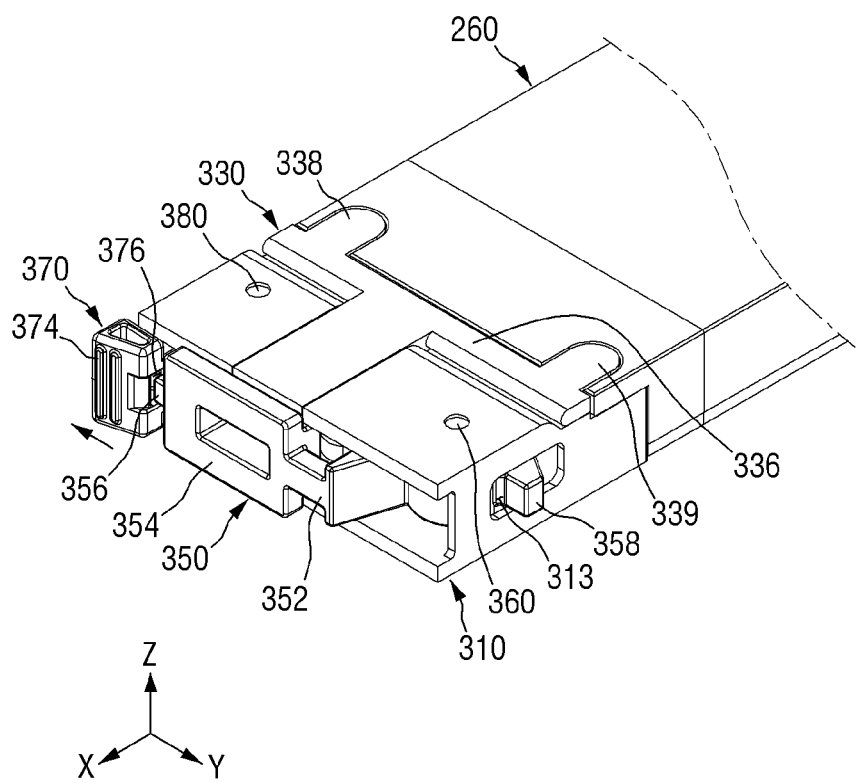
Figure 18:
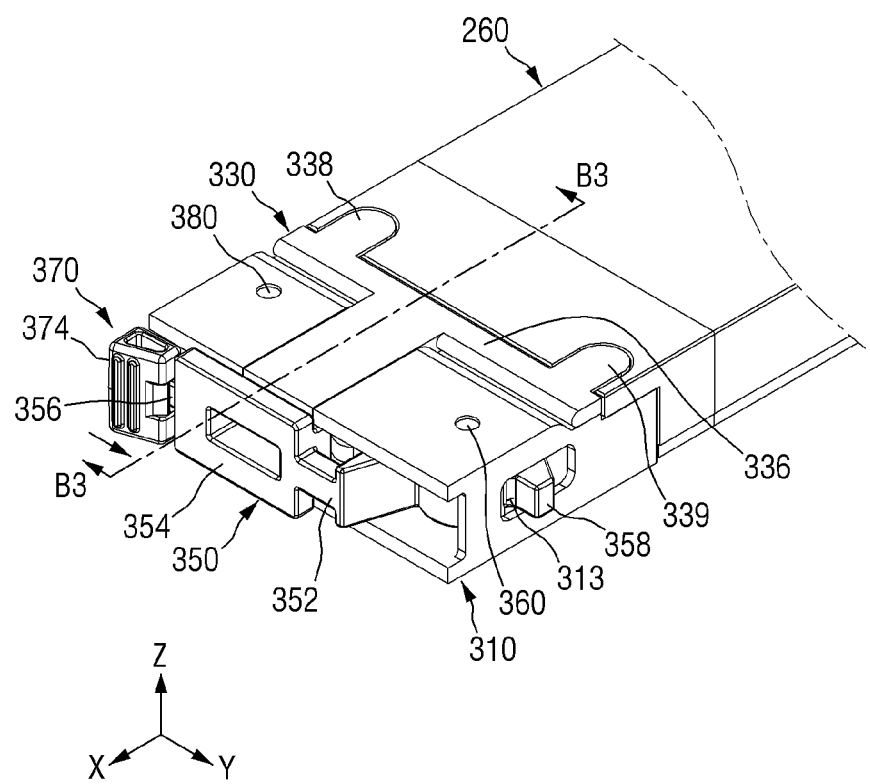
Figure 19:
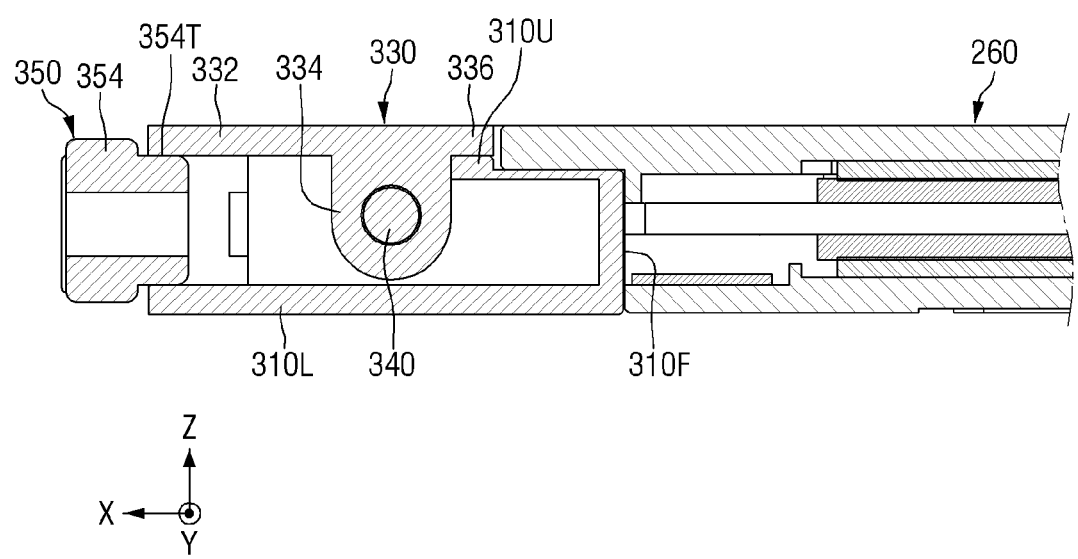

Referring to FIGS. 17 to 19, the handle 350 is coupled to the handle locker 370. For reference, FIG. 19 is a cross-sectional view taken along line B3-B3 of FIG. 18.

For example, the user may apply a force to the first support portion 354 such that the first support portion 354 of the handle 350 faces the rear surface 310B of the case 310. Accordingly, the handle 350 may rotate against a restoring force of the second elastic members 360 and 365, and the first support portion 354 of the handle 350 may face the rear surface 310B of the case 310. In other words, force may be applied to the handle 350 to rotate the handle 350 towards the interior space 312 until the handle 350 is in the YZ plane of the rear surface 310B of the case 310.

In some exemplary embodiments, once the first support portion 354 of the handle 350 faces the rear surface 310B of the case 310, the handle 350 may be coupled to the handle locker 370. For example, the second coupling protrusion 356 protruding from the first support portion 354 may be inserted into and coupled to the coupling groove 376 of the second support portion 374.

In some exemplary embodiments, the handle 350 rotating against the restoring force of the second elastic members 360 and 365 may apply a force to the handle locker 370 and may be coupled to the handle locker 370. For example, the first support portion 354 rotating against the restoring force of the second elastic members 360 and 365 may apply a force to the second support portion 374 so as to move in a direction away from the first support portion 354 as illustrated in FIG. 17. In other words, the handle locker 370 may be pushed in the −Y direction by the second coupling protrusion 356. Accordingly, as shown in FIG. 17, the handle locker 370 may rotate against a restoring force of the third elastic members 380 and 385, and the second support portion 374 may be operated in a direction away from the first support portion 354. When the second coupling protrusion 356 is inserted into the coupling groove 376 as the first support portion 354 rotates, the handle locker 370 may be rotated by the restoring force of the third elastic members 380 and 385. Accordingly, as shown in FIG. 18, the handle locker 370 may be rotated by the restoring force of the third elastic members 380 and 385, and the coupling between the handle 350 and the handle locker 370 is completed. In other words, once the second coupling protrusion 356 is inserted into the coupling groove 376, the handle locker 370 may move in the +Y direction by the restoring force to hold the second coupling portion 356 in the coupling groove 376.

In some exemplary embodiments, the handle 350 coupled to the handle locker 370 may support the locking lever 330. For example, as shown in FIG. 19, the first support portion 354 of the handle 350 coupled to the handle locker 370 may support the locking lever 330. For example, when the locking lever 330 is in a closed state, a lower surface of the plate portion 332 of the locking lever 330 may be in contact with an upper surface 354T of the first support portion 354 of the handle 350. Accordingly, the first support portion 354 of the handle 350 may support the locking lever 330 against an external force acting in a direction in which coupling by the locking lever 330 is released (for example, an external force against the restoring force of the first elastic members 340 and 345).

Accordingly, as shown in FIG. 2, it is possible to provide a closed state in which the extension kit 300 may be coupled to the storage device 200. In addition, in order to separate the extension kit 300 from the storage device 200, operations described above with reference to FIGS. 10 to 19 may be performed in the reverse order. Accordingly, as shown in FIG. 3, it is possible to provide an open state in which the extension kit 300 may be separated from the storage device 200.

For the replacement, maintenance, and defect analysis of the storage device, the storage device and the extension kit may be mounted or dismounted. For example, coupling members such as screws, screw nails, piece bolts, and/or bolts may be used to mount or dismount the extension kit to or from the first and second fixing holes FX1 and FX2 of the enclosure 260. However, since the use of the coupling members requires a separate tool or the like to re-couple the extension kit, the mounting or the dismounting is not easy.

On the other hand, in the storage device assembly according to some exemplary embodiments, the mounting or the dismounting is easy to perform without using a separate tool. Specifically, as described above, in the storage device assembly according to some exemplary embodiments, the locking lever 330 may be coupled to the enclosure 260 or may be separated from the enclosure 260 using only the restoring force of the first elastic members 340 and 345. Accordingly, an extension kit easy to mount or dismount and a storage device assembly including the same may be provided.

In addition, as described above, in the storage device assembly according to some exemplary embodiments, the locking lever 330 in a closed state may be supported using the handle 350. Accordingly, an extension kit with improved coupling force and reliability and a storage device assembly including the same may be provided.

Figure 20:
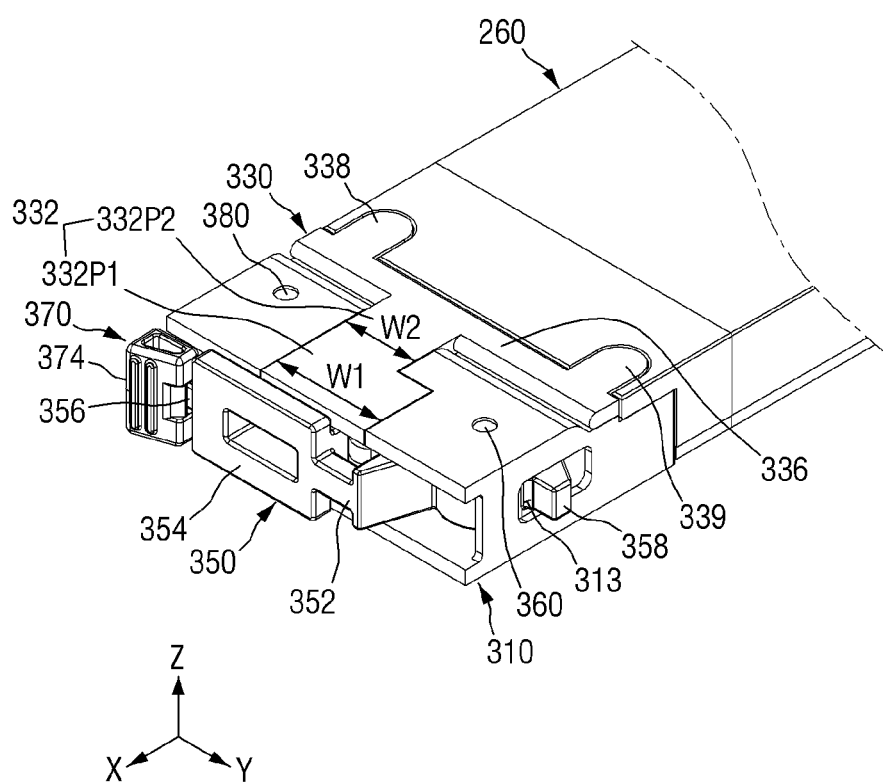
FIG. 20 is a perspective view for describing a storage device assembly according to some exemplary embodiments.

FIG. 20 is a perspective view for describing a storage device assembly according to some exemplary embodiments. For convenience of description, contents overlapping those described above with reference to FIGS. 1 to 19 will be briefly described or omitted for conciseness.

Referring to FIG. 20, in the storage device assembly according to some exemplary embodiments, a plate portion 332 includes a first sub-plate portion 332P1 and a second sub-plate portion 332P2.

The first sub-plate portion 332P1 may be closer to a rear surface 310B of a case 310 than the second sub-plate portion 332P2. In some exemplary embodiments, the second sub-plate portion 332P2 may connect a lever portion 334 to the first sub-plate portion 332P1.

The first sub-plate portion 332P1 and the second sub-plate portion 332P2 may have different widths in a second direction Y. For example, the first sub-plate portion 332P2 may have a first width W1 in the second direction Y, and the second sub-plate portion 332P2 may have a second width W2 in the second direction Y. In some exemplary embodiments, the second width W2 may be smaller than the first width W1. In this case, a user may more easily apply a force to the plate portion 332 to provide a locking lever 330 in an open state.

In some exemplary embodiments, the first sub-plate portion 332P1 may be positioned at a central portion of the case 310 in the second direction Y. For example, a spacing distance between the first sub-plate portion 332P1 and a first sidewall 310S1 of the case 310 may be the same as a spacing distance between the first sub-plate portion 332P1 and a second sidewall 310S2 of the case 310. In this case, the user may more uniformly apply a force to the plate portion 332 to provide the locking lever 330 in an open state.

Figure 21:
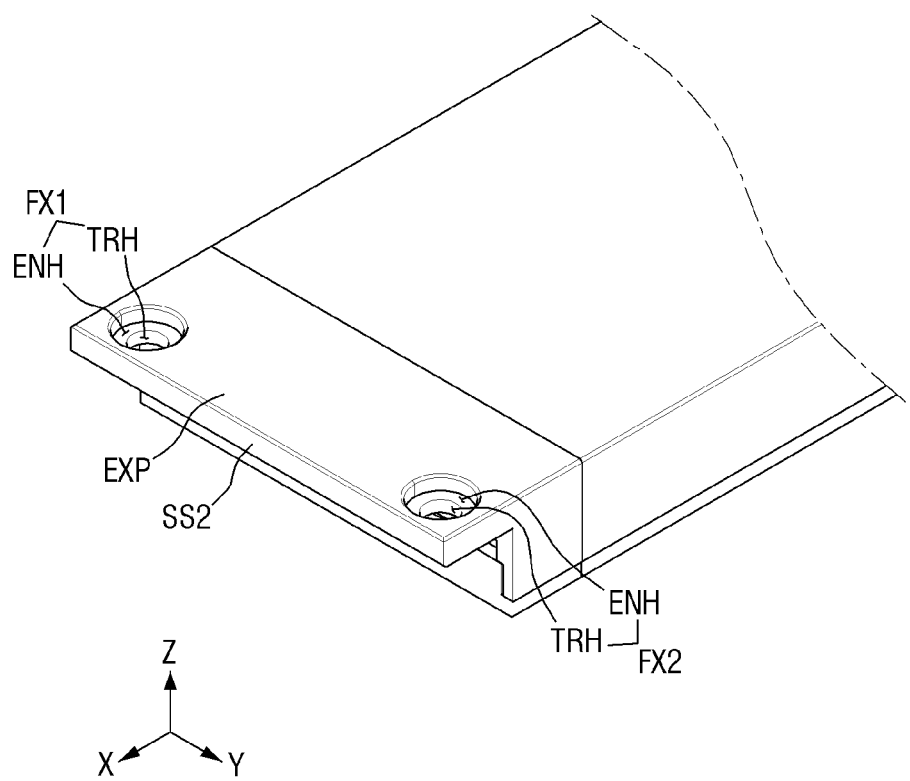
FIG. 21 is a partially enlarged perspective view for describing a storage device of the storage assembly according to some exemplary embodiments.

FIG. 21 is a partially enlarged perspective view for describing a storage device assembly according to some exemplary embodiments. For convenience of description, contents overlapping those described above with reference to FIGS. 1 to 19 will be briefly described or omitted for conciseness.

Referring to FIG. 21, in the storage device assembly according to some exemplary embodiments, expansion hole portions ENH of the first and second fixing holes FX1 and FX2 each form a closed curve in a plan view.

For example, like through-hole portions TRH of the first and second fixing holes FX1 and FX2, the expansion hole portions ENH of the first and second fixing holes FX1 and FX2 may each form a circular closed curve in a plan view. The expansion hole portion ENH may have an inner diameter greater than that of the through-hole portion TRH, and the through-hole portion TRH may be disposed in the expansion hole portion ENH in a plan view. In some exemplary embodiments, the expansion hole portion ENH may be concentric and coaxial with the through-hole portion TRH in a plan view.

When a locking lever 330 is in a closed state, the first and second locking portions 338 and 339 may be disposed on the expansion hole portions ENH of the first and second fixing holes FX1 and FX2, respectively. In some embodiments, when the locking lever 330 is in a closed state, at least portions of the first and second locking portions 338 and 339 may be disposed on an upper surface of an enclosure 260.

Figure 22:
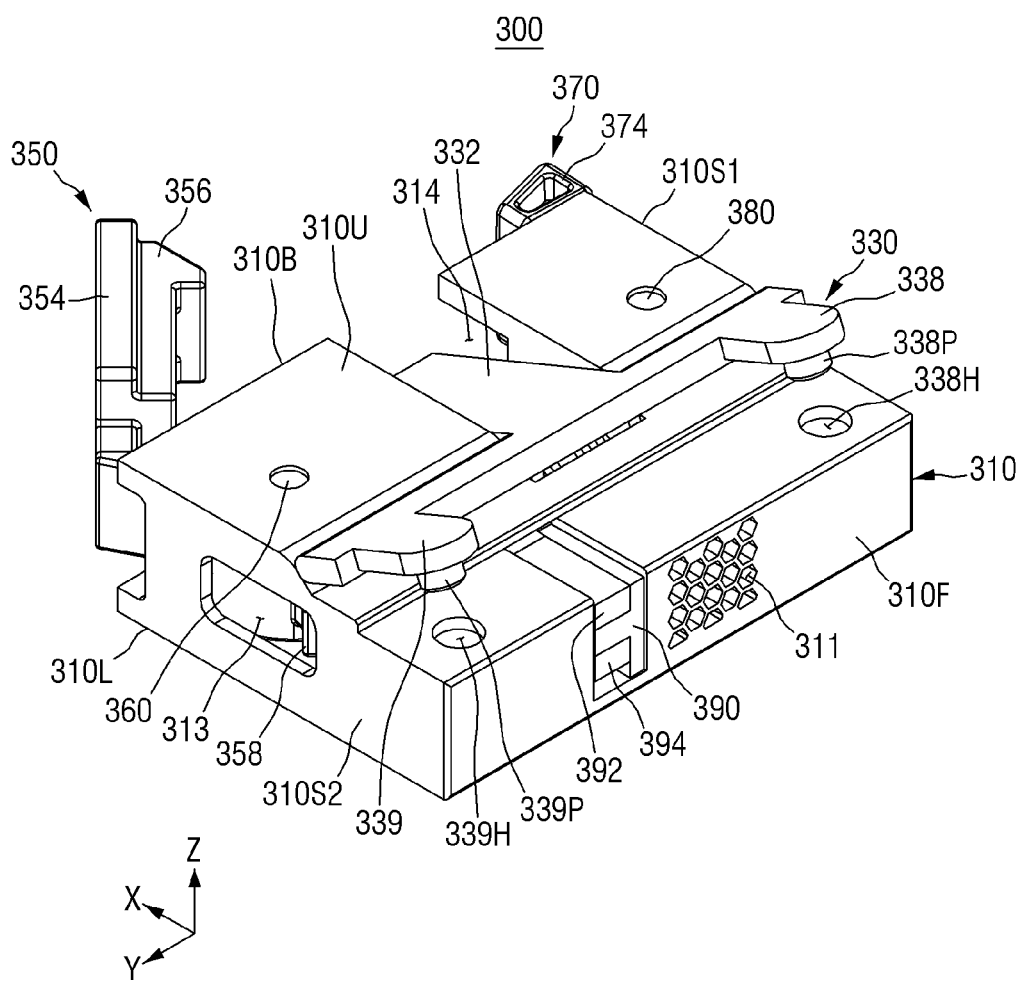
FIG. 22 is a perspective view for describing an extension kit of a storage device assembly according to some exemplary embodiments.

FIG. 22 is a perspective view for describing an extension kit of a storage device assembly according to some exemplary embodiments. For convenience of description, contents overlapping those described above with reference to FIGS. 1 to 19 will be briefly described or omitted for conciseness.

Referring to FIG. 22, in the storage device assembly according to some exemplary embodiments, a locking lever 330 may include a first protrusion 338P and a second protrusion 339P.

The first and second protrusions 338P and 339P may protrude from lower surfaces of the first and second locking portions 338 and 339. For example, the first protrusion 338P may protrude from a lower surface of the first locking portion 338, and the second protrusion 339P may protrude from a lower surface of the second locking portion 339.

The first and second protrusions 338P and 339P may guide an extension kit 300 to an enclosure 260. For example, when the locking lever 330 is in a closed state, the first and second protrusions 338P and 339P may be inserted into the first and second fixing holes FX1 and FX2 of the enclosure 260, respectively.

In some exemplary embodiments, a case 310 may further include a first insertion groove 338H and a second insertion groove 339H corresponding to the first and second protrusions 338P and 339P, respectively. The first and second insertion grooves 338H and 339H may be recessed from a surface of the case 310. For example, the first and second insertion grooves 338H and 339H may be recessed from an upper surface of the case 310 to extend in a third direction Z.

The first and second insertion grooves 338H and 339H may provide spaces into which the first and second protrusions 338P and 339P are inserted, respectively. For example, when the locking lever 330 is in a closed state, the first and second protrusions 338P and 339P may pass through the first and second fixing holes FX1 and FX2 of the enclosure 260 to be inserted into the first and second insertion grooves 338H and 339H, respectively.

In FIG. 22, although the case 310 is illustrated as having the first and second insertion grooves 338H and 339H, but this configuration is merely an example. For another example, the upper surface of the case 310 corresponding to the first and second protrusions 338P and 339P may be flat without having the first and second insertion grooves 338H and 339H.

Figure 23:
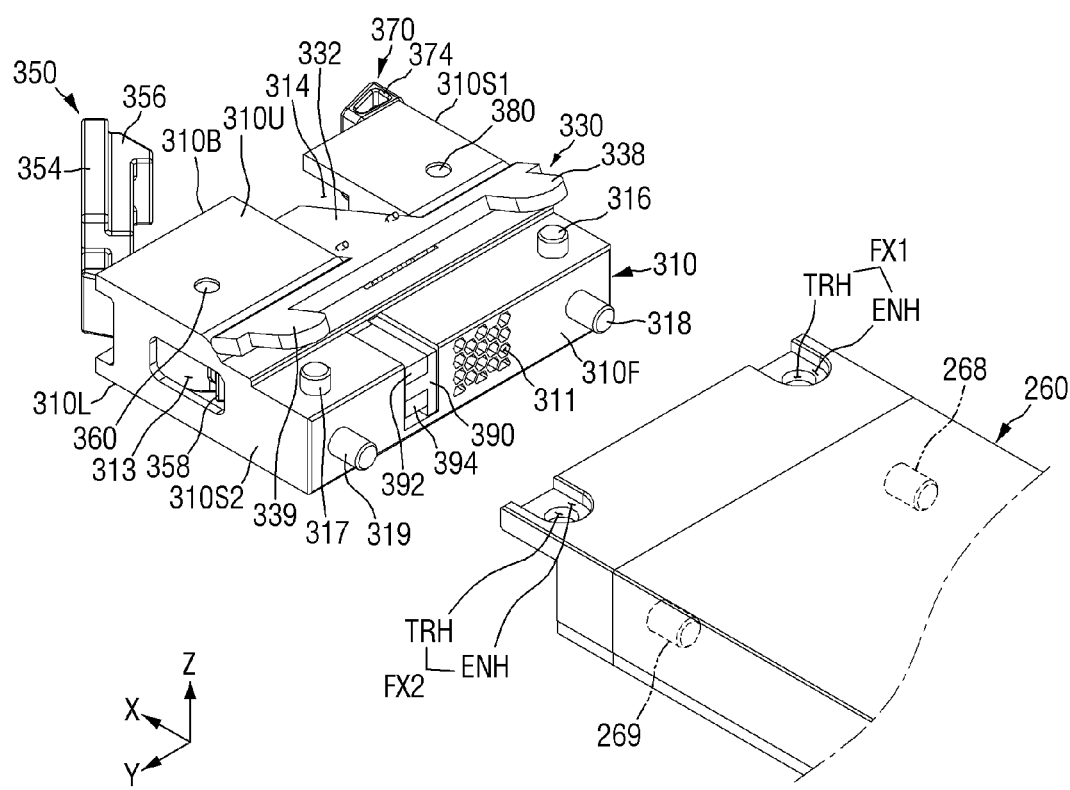
FIG. 23 is an exploded perspective view for describing a storage device assembly according to some exemplary embodiments.

FIG. 23 is an exploded perspective view for describing a storage device assembly according to some exemplary embodiments. For convenience of description, contents overlapping those described above with reference to FIGS. 1 to 19 will be briefly described or omitted for conciseness.

Referring to FIG. 23, in the storage device assembly according to some exemplary embodiments, a case 310 may further include a first guide pin 318 and a second guide pin 319.

The first and second guide pins 318 and 319 may protrude from a surface of the case 310. For example, the first and second guide pins 318 and 319 may protrude from a front surface 310F of the case 310 to extend in a first direction X.

The first and second guide pins 318 and 319 may guide an extension kit 300 to an enclosure 260. For example, the enclosure 260 may have a first guide groove 268 and a second guide groove 269 corresponding respectively to the first and second guide pins 318 and 319. For example, the first and second guide grooves 268 and 269 may be recessed from a surface of the enclosure 260 to extend in the first direction X.

When the extension kit 300 is coupled to the enclosure 260, the first and second guide pins 318 and 319 of the extension kit 300 may be inserted into the first and second guide grooves 268 and 269 of the enclosure 260, respectively. For example, the first guide pin 318 may be inserted into the first guide groove 268, and the second guide pin 319 may be inserted into the second guide groove 269. Accordingly, it is possible to provide an extension kit with improved coupling force and reliability and a storage device assembly including the same.

The shape, arrangement, and number of the first and second guide pins 318 and 319 and the first and second guide grooves 268 and 269 corresponding thereto are not limited to the those shown in the drawings and in various embodiments may be varied. For example, while two guide pins and two guide grooves are illustrated in FIG. 23, in some embodiments, only one guide pin and one guide groove may be provided. In other embodiments, more than two guide pins and more than two guide grooves may be provided.

Figure 24:
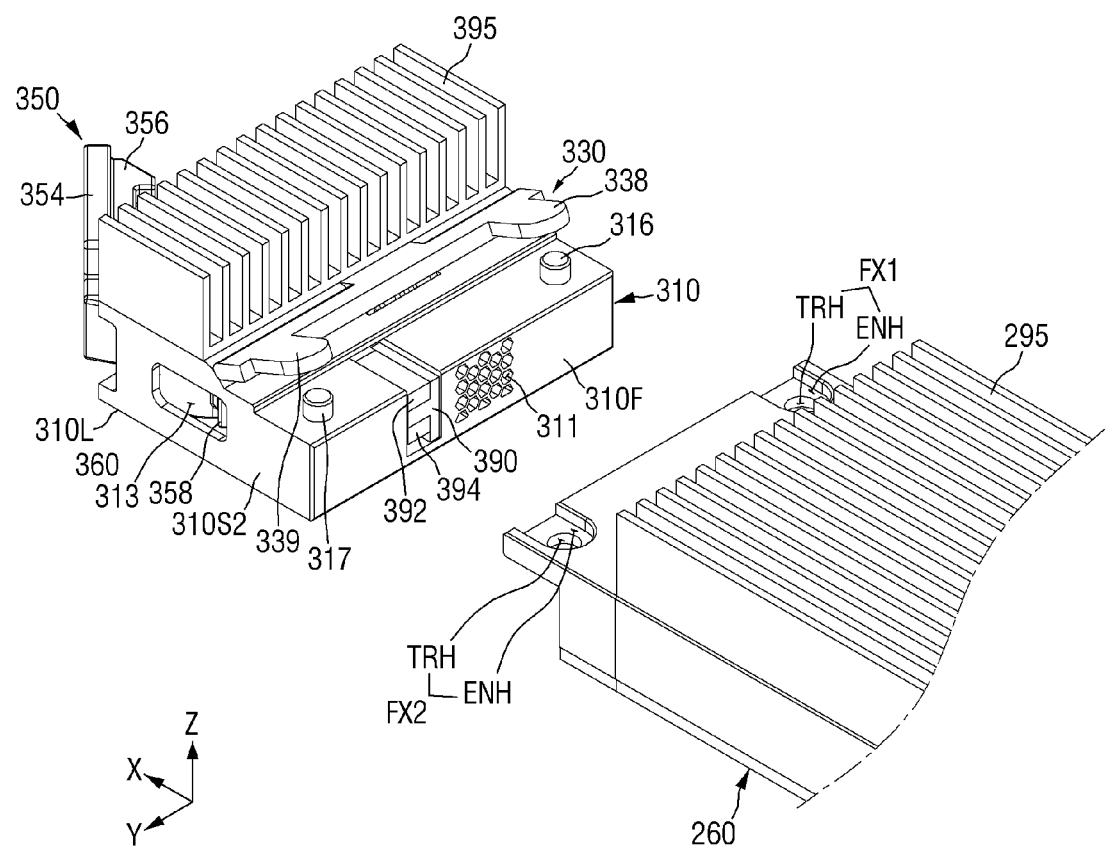
FIG. 24 is an exploded perspective view for describing a storage device assembly according to some exemplary embodiments.

FIG. 24 is an exploded perspective view for describing a storage device assembly according to some exemplary embodiments. For convenience of description, contents overlapping those described above with reference to FIGS. 1 to 19 will be briefly described or omitted for conciseness.

Referring to FIG. 24, in the storage device assembly according to some embodiments, the storage device 200 may further include a first heat sink 295.

The first heat sink 295 may be disposed on an enclosure 260. For example, the first heat sink 295 may be disposed on an upper surface of the enclosure 260. The first heat sink 295 may absorb heat from the enclosure 260 and may efficiently radiate the absorbed heat. In order to increase a heat exchange area to increase a heat radiation effect, the first heat sink 295 may include a plurality of heat radiation fins.

Although the plurality of heat radiation fins are illustrated as being arranged in a second direction Y, this arrangement is merely an example.

In some exemplary embodiments, the extension kit 300 may further include a second heat sink 395. The second heat sink 395 may be disposed on a case 310. For example, the second heat sink 395 may be disposed on an upper surface of the case 310. The second heat sink 395 may absorb heat from the case 310 and may efficiently radiate the absorbed heat. In order to increase a heat exchange area to increase a heat radiation effect, the second heat sink 395 may include a plurality of heat radiation fins. Although the plurality of heat radiation fins are illustrated as being arranged in the second direction Y, this arrangement is merely an example.

In some exemplary embodiments, a height of the second heat sink 395 may correspond to a height of the first heat sink 295. For example, the height of the second heat sink 395 may be the same as the height of the first heat sink 295 but embodiments are not limited thereto.

Figure 25:
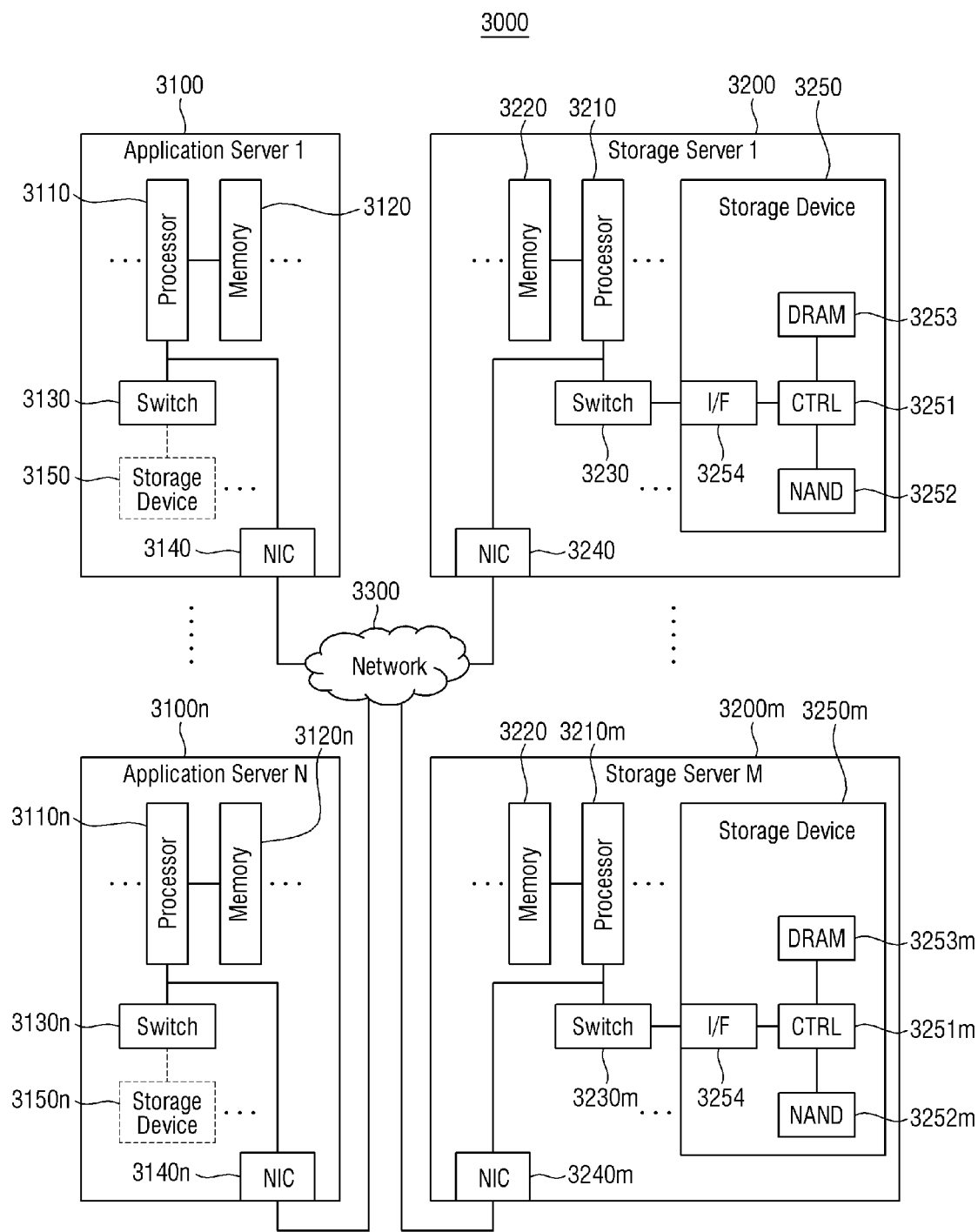
FIG. 25 is a block diagram for describing a data center in which a storage device assembly according to some exemplary embodiments is used.

FIG. 25 is a block diagram for describing a data center in which a storage device assembly according to some exemplary embodiments is used. For convenience of description, contents overlapping those described above with reference to FIGS. 1 to 24 will be briefly described or omitted for conciseness.

Referring to FIG. 25, a data center 3000 may be a facility that collects various types of data and provides services and may be referred to as a data storage center. The data center 3000 may be a system for operating a search engine and a database and may be a computing system used by a company such as a bank or a government organization. The data center 3000 may include application servers 3100 to 3100n and storage servers 3200 to 3200m. The number of the application servers 3100 to 3100n and the number of the storage servers 3200 to 3200m may be variously selected according to exemplary embodiments. In some embodiments, the number of the application servers 3100 to 3100n and the number of the storage servers 3200 to 3200m may be different.

The application server 3100 may include at least one processor 3110 and at last one memory 3120, and the storage server 3200 may include at least one processor 3210 and at least one memory 3220. When an example of the storage server 3200 is described, the processor 3210 may control overall operation of the storage server 3200 and access the memory 3220 to execute commands and/or data loaded in the memory 3220. The memory 3220 may be a double data rate synchronous DRAM (DDR SDRAM), a high bandwidth memory (HBM), a hybrid memory cube (HMC), a dual in-line memory module (DIMM), an Optane DIMM, or a nonvolatile DIMM (NVMDIMM). According to exemplary embodiments, the number of the processors 3210 and the number of the memories 3220 included in the storage server 3200 may be variously selected.

In some exemplary embodiments, the processor 3210 and the memory 3220 may be provided as a processor-memory pair. In some embodiments, the numbers of the processors 3210 and the memories 3220 may be different. The processor 3210 may include a single-core processor or a multi-core processor. The descriptions of the storage server 3200 may be similarly applied to the application server 3100. In some embodiments, the application server 3100 may omit a storage device 3150. The storage server 3200 may include at least one storage device 3250. The number of the storage devices 3250 included in the storage server 3200 may be variously selected.

The storage device assembly according to some exemplary embodiments described above with reference to FIGS. 1 to 24 may be mounted on or dismounted from the storage server 3200, which is a host, in the form of one storage device 3250.

The application servers 3100 to 3100n and the storage servers 3200 to 3200m may communicate with each other through a network 3300. The network 3300 may be implemented using Fiber Channel (FC) or Ethernet. In this case, the FC is a medium used for relatively high-speed data transmission and may use an optical switch that provides high performance/high availability. The storage servers 3200 to 3200m may be provided as file storages, block storages, or object storages according to an access method of the network 3300.

In some exemplary embodiments, the network 3300 may be a storage-dedicated network such as a storage area network (SAN). As an example, the SAN may be an FC-SAN that uses an FC network and is implemented according to an FC Protocol (FCP). For another example, the SAN may be an IP-SAN that uses a TCP/IP network and is implemented according to an SCSI over TCP/IP or Internet SCSI (iSCSI) protocol. In some other exemplary embodiments, the network 1300 may be a generic network such as a TCP/IP network. For example, the network 1300 may be implemented according to a protocol such as FC over Ethernet (FCoE), network attached storage (NAS), and NVMe over Fabrics (NVMe-oF).

Hereinafter, descriptions will be given focusing on the application server 3100 and the storage server 3200. The descriptions of the application server 3100 may be applied to another application server 3100n, and the descriptions of the storage server 3200 may be applied to another storage server 3200m.

The application server 3100 may store data requested to be stored by a user or a client in one of the storage servers 3200 to 3200m through the network 3300. In addition, the application server 3100 may acquire data requested to be read by the user or the client from one of the storage servers 3200 to 3200m through the network 3300. For example, the application server 3100 may be implemented as a web server or a database management system (DBMS).

The application server 3100 may access a memory 3120n or a storage device 3150n included in the other application server 3100n through the network 3300 and may access memories 3220 to 3220m or storage devices 3250 to 3250m included in the storage servers 3200 to 3200m through the network 3300. Accordingly, the application server 3100 may perform various operations on data stored in the application servers 3100 to 3100n and/or the storage servers 3200 to 3200m. For example, the application server 3100 may execute a command for transmitting or copying data between the application servers 3100 to 3100n and/or the storage servers 3200 to 3200m. In this case, data may be transmitted to memories 3120 to 3120n of the application servers 3100 to 3100n from the storage devices 3250 to 3250m of the storage servers 3200 to 3200m through the memories 3220 to 3220m of the storage servers 3200 to 3200m or may be transmitted directly to the memories 3120 to 3120n of the application servers 3100 to 3100n. Data transmitted through the network 3300 may be data encrypted for security or privacy.

When an example of the storage server 3200 is described, an interface (I/F) 3254 may provide a physical connection between the processor 3210 and a controller (CTRL) 3251 and a physical connection between an NIC 3240 and the controller 3251. For example, the interface 3254 may be implemented in a direct attached storage (DAS) method in which the storage device 3250 is directly connected using a dedicated cable. In addition, for example, the interface 3254 may be implemented as various interface types such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), an NVM express (NVMe), IEEE 1394, a universal serial bus (USB), a secure digital (SD) card, a multi-media card (MMC), an embedded multi-media card (eMMC), a universal flash storage (UFS), an embedded universal flash storage (eUFS), and a compact flash (CF) card interface.

The storage server 3200 may further include a switch 3230 and the NIC 3240. The switch 3230 may selectively connect the processor 3210 and the storage device 3250 or may selectively connect the NIC 3240 and the storage device 3250 under control of the processor 3210.

In some exemplary embodiments, the NIC 3240 may include a network interface card, a network adapter, and the like. The NIC 3240 may be connected to the network 3300 through a wired interface, a wireless interface, a Bluetooth interface, an optical interface, or the like. The NIC 3240 may include an internal memory, a digital signal processor (DSP), a host bus interface, and the like and may be connected to the processor 3210 and/or the switch 3230 through the host bus interface. The host bus interface may be implemented as one of the above-described examples of the interface 3254. In one exemplary embodiment, the NIC 3240 may be integrated with at least one of the processor 3210, the switch 3230, and the storage device 3250.

In the storage servers 3200 to 3200m or the application servers 3100 to 3100n, the processor may transmit a command to the storage devices 3130 to 3130n or 3250 to 3250m or the memories 3120 to 3120n or 3220 to 3220m) to program or read data. In this case, the data may be data that is error-corrected through an error correction code (ECC) engine. The data may be data that is processed through data bus inversion (DBI) or data masking (DM) and may include cyclic redundancy code (CRC) information. The data may be data encrypted for security or privacy.

The storage devices 3150 to 3150m or 3250 to 3250m may transmit a control signal and command/address signals to NAND flash memory devices 3252 to 3252m in response to a read command received from the processor. Accordingly, when data is read from the NAND flash memory devices 3252 to 3252m, a read enable (RE) signal may be input as a data output control signal and may serve to output data to a DQ bus. A data strobe (DQS) may be generated using the RE signal. The command and address signals may be latched in a page buffer according to a rising edge or a falling edge of a write enable (WE) signal.

The controller 3251 may control the overall operation of the storage device 3250. In one exemplary embodiment, the controller 3251 may include a static random access memory (SRAM). The controller 3251 may write data to the NAND flash memory device 3252 in response to a write command or may read data from the NAND flash memory device 3252 in response to a read command. For example, the write command and/or the read command may be provided from the processor 3210 of the storage server 3200, a processor 3210m from another storage server 3200m, or processors 3110 to 3110n of the application servers 3100 to 3100n. A DRAM 3253 may temporarily store (buffer) data to be written to the NAND flash memory device 3252 and/or data read from the NAND flash memory device 3252. In addition, the DRAM 3253 may store meta data. Here, the metadata is user data or data generated so as to manage the NAND flash memory device 3252 by the controller 3251. The storage device 3250 may include a secure element (SE) for security or privacy.

Those skilled in the art will appreciate that many variations and modifications may be made to the various embodiments described herein without substantially departing from the principles of the present inventive concept. Therefore, the disclosed embodiments are used in a generic and descriptive sense only and not for purposes of limitation.

What is claimed is:

1. An extension kit comprising:
   a case having an interior space which extends in a first direction;
   a locking lever including a lever portion which is rotatable about a first rotation axis extending in a second direction intersecting the first direction, a plate portion which extends from the lever portion and which is exposed at the case, an arm portion which is exposed from the case and extends in the second direction from the plate portion, and a first locking portion which protrudes from the arm portion; and
   a first elastic member in the interior space of the case, the first elastic member configured to elastically connect the case and the locking lever in the interior space of the case.

2. The extension kit of claim 1, wherein the case includes a protruding pin protruding from a surface thereof, and
   the first locking portion is disposed in a position corresponding to the protruding pin.

3. The extension kit of claim 2, wherein, as the lever portion rotates about the first rotation axis, the first locking portion comes into contact with the protruding pin.

4. The extension kit of claim 1, wherein the case has a pinhole extending in the second direction,
   the lever portion has a lever hole extending in the second direction, and
   the first elastic member includes a fixing pin which extends in the second direction in the interior space and which is inserted into the pinhole and the lever hole, and a spring which is wound around the fixing pin.

5. The extension kit of claim 1, wherein the plate portion extends from a first side of the arm portion, and
   the first locking portion extends from a second side of the arm portion opposite the first side.

6. The extension kit of claim 1, wherein the plate portion, the arm portion, and the first locking portion are disposed to be coplanar with each other.

7. The extension kit of claim 1, wherein the locking lever further includes a second locking portion which protrudes from the arm portion and is spaced apart from the first locking portion in the second direction.

8. The extension kit of claim 1, further comprising:
   a handle including a first rotation portion which is rotatable about a second rotation axis extending in a third direction intersecting the first direction and the second direction, and a first support portion which extends from the first rotation portion; and
   a second elastic member in the interior space of the case, the second elastic member being configured to elastically connect the case and the first rotation portion in the interior space of the case.

9. The extension kit of claim 8, wherein the case has a pinhole extending in the third direction, and
   the second elastic member includes a fixing pin which extends in the third direction in the interior space and is inserted into the pinhole, and a spring which is wound around the fixing pin.

10. The extension kit of claim 8, further comprising:
a handle locker including a second rotation portion which is rotatable about a third rotation axis extending in the third direction and which is spaced apart from the first rotation portion, and a second support portion which extends from the second rotation portion and which is configured to be coupled to the first support portion; and
a third elastic member in the interior space of the case, the third elastic member being configured to elastically connect the case and the second rotation portion in the interior space of the case.

11. A storage device assembly comprising:
a storage device having a fixing hole; and
an extension kit configured to be mounted to and dismounted from the storage device,
wherein the extension kit includes:
a case having a front surface facing the storage device and a rear surface opposite to the front surface;
a locking lever including a lever portion which is supported by the case to be rotatable, and a locking portion which extends from the lever portion and is disposed above the fixing hole to cover the fixing hole in a configuration in which the extension kit is mounted to the storage device; and
a handle including a first rotation portion which is supported by the case to be rotatable, and a first support portion which extends from the first rotation portion and which is disposed at the rear surface of the case.

12. The storage device assembly of claim 11, wherein the fixing hole includes a through-hole portion having a first inner diameter and an expansion hole portion having a second inner diameter greater than the first inner diameter.

13. The storage device assembly of claim 12, wherein the expansion hole portion extends to a side of the storage device that faces the extension kit.

14. The storage device assembly of claim 11, wherein the storage device and the extension kit are disposed in a first direction, and
the lever portion is elastically rotatable about a first rotation axis extending in a second direction intersecting the first direction.

15. The storage device assembly of claim 14, wherein the first rotation portion is elastically rotatable about a second rotation axis extending in a third direction intersecting the first direction and the second direction.

16. The storage device assembly of claim 11, wherein the extension kit further includes a handle locker including a second rotation portion which is supported by the case to be rotatable and which is spaced apart from the first rotation portion, and a second support portion disposed at the rear surface of the case and configured to be coupled to the first support portion.

\* \* \* \* \*